(12) United States Patent
Okada

(10) Patent No.: US 7,705,282 B2
(45) Date of Patent: Apr. 27, 2010

(54) EDS PROTECTION FOR AN IMAGE DETECTING DEVICE

(75) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/230,824

(22) Filed: Sep. 5, 2008

(65) Prior Publication Data

US 2009/0065680 A1 Mar. 12, 2009

(30) Foreign Application Priority Data

Sep. 10, 2007 (JP) ............................. 2007-233983
Jun. 6, 2008 (JP) ............................. 2008-149701

(51) Int. Cl.
*H01L 27/00* (2006.01)
*H02H 9/00* (2006.01)

(52) U.S. Cl. ....................... 250/208.1; 361/56; 257/173

(58) Field of Classification Search .............. 250/208.1; 361/56; 257/173
See application file for complete search history.

(56) References Cited

U.S. PATENT DOCUMENTS 6,696,701 B2 * 2/2004 Hector et al. .................. 257/72

FOREIGN PATENT DOCUMENTS

JP A 10-177186 6/1998

* cited by examiner

*Primary Examiner*—Thanh X Luu
(74) *Attorney, Agent, or Firm*—Sheldon J. Moss; Chad Herring

(57) ABSTRACT

An image detecting device includes a substrate including plural accumulating portions, plural data lines, plural first protection lines, plural first diodes, and plural second diodes. The plural accumulating portions, due to the irradiation of incident electromagnetic waves expressing an image which is an object of detection, charges expressing the image are accumulated. In the plural data lines, the plural accumulating portions are respectively connected individually via switching elements. The plural first protection lines are for protecting a circuit from excess voltage. In the plural first diodes, anodes are connected to a portion of the plural first protection lines respectively, and cathodes are connected to the plural data lines respectively. In the plural of second diodes, cathodes are connected to another portion of the plural first protection lines respectively, and anodes are connected to the plural data lines respectively.

20 Claims, 17 Drawing Sheets

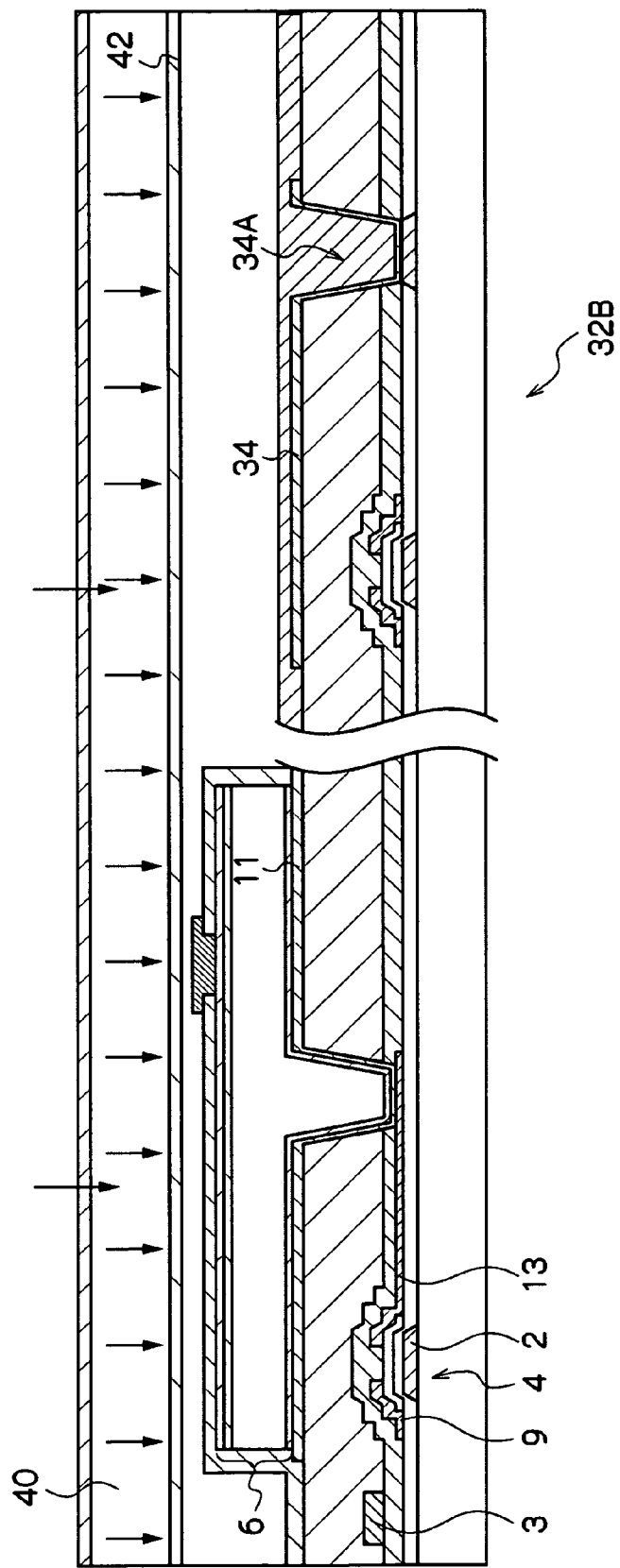

EDS PROTECTION FOR AN IMAGE DETECTING DEVICE

CROSS-REFERENCE TO RELATED APPLICATION

This application claims priority under 35 USC 119 from Japanese Patent Applications No. 2007-233983 and No. 2008-149701, the disclosure of which is incorporated by reference herein.

BACKGROUND OF THE INVENTION

1. Field of the Invention

The present invention relates to an image detecting device, and in particular, to an image detecting device that detects an image by using a substrate at which are provided protection lines for discharging static electricity that is generated at the time when the substrate is manufactured.

2. Description of the Related Art

Radiation image detecting devices, such as FPDs (flat panel detectors) and the like in which an X-ray sensitive layer is disposed on a TFT (thin film transistor) active matrix substrate and which can convert X-ray information directly into digital data, have been put into practice in recent years. As compared with a conventional imaging plate, an FPD has the advantages that an image can be confirmed immediately and that moving images as well can be confirmed, and the popularization of FPDs has advanced rapidly.

In this type of radiation image detecting device, it is important to detect an X-ray image at a size that projects a human body, and therefore, substrates of large sizes exceeding 30×30 cm are needed. However, it is difficult to manufacture a substrate of such a large size from a silicon substrate. Therefore, currently, TFT active matrix substrates that are formed on a thin plate glass are mainly being used.

TFT active matrix substrates are employed as driving substrates for LCDs (liquid crystal displays), and are stable technologically and in terms of cost as well. Therefore, TFT array substrates for image detecting devices as well are mainly manufactured on assembly lines for TFTs for LCDs from the standpoint of cost.

A circuit diagram of a conventional TFT active matrix substrate 10' for an image detecting device is shown in FIG. 6.

As shown in FIG. 6, the TFT active matrix substrate 10' is structured such that a large number of pixels are arrayed in a two-dimensional form. The pixel is structured to include a charge collecting electrode 11' that collects charges generated at an unillustrated image sensor portion, a charge accumulating capacitor 5' accumulating detected charge signals, and a thin film transistor (hereinafter called "TFT switch") 4' for reading out the charges accumulated in the charge accumulating capacitor 5'. Further, plural scan lines (gate lines) 101' for turning the TFT switches 4' on and off, and plural data lines 3' for removing the charges accumulated in the charge accumulating capacitors 5', are provided at the TFT active matrix substrate 10'. One electrode of the charge accumulating capacitor 5' is grounded via an unillustrated line and is ground level. Note that, in FIG. 6, the one electrode of the charge accumulating capacitor 5' is illustrated as being connected to ground.

The respective data lines 3' and the respective scan lines 101' of the TFT active matrix substrate 10' are connected to a common line 110' via bidirectional diodes 30' for circuit protection respectively, in order to prevent electrostatic breakage at the time of manufacturing.

An example of the structure of one diode 31' that structures this conventional bidirectional diode 30' is shown in FIG. 7. In a TFT active matrix substrate that uses an amorphous silicon TFT, the diode 31' can be structured easily by connecting the gate electrode and the drain electrode of the TFT switch, as shown in FIG. 7.

FIG. 8 is shown as an equivalent circuit focusing on one TFT element of the TFT active matrix substrate 10' shown in FIG. 6.

As shown in FIG. 8, at each TFT element of the TFT active matrix substrate 10', between the gate electrode of the TFT switch 4' and the data line 3' is equivalent to being connected by the bidirectional diode 30' that is structured by the anodes and cathodes of two of the diodes 31' respectively being connected to one another in parallel. Therefore, if the electrode potential of one becomes high, charges flow to the other, and the potential can be prevented from becoming high.

The problem of static electricity, in a case in which such a TFT active matrix substrate is manufactured by using a TFT assembly line for LCDs, is described next with reference to FIG. 9A through 9E.

The size of the substrate that can be manufactured on an assembly line for TFTs for LCDs depends on the device size of the assembly line, and is a size peculiar to that line. Currently, large substrates of mainly about 1 $m^2$ can be manufactured.

In a case of using a TFT assembly line for LCDs that can manufacture such large-sized substrates, a TFT array substrate 10B', at which a single or plural TFT array cells 10A' for FPDs are formed, is manufactured (see FIG. 9A).

The manufactured TFT array substrate 10B' is divided in primary dividing process, and the TFT array cells 10A' are cut out (see FIG. 9B). In a sensor layer forming step that is carried out after, layer formation is carried out mainly by vacuum deposition or CVD (chemical vapor deposition), and therefore, the device cost-increases in proportion to the substrate size. Accordingly, in the primary dividing process, it is desirable to cut the TFT array cells 10A' out from the TFT array substrate 10B' at the minimum size needed as the TFT array cells 10A', and make the chamber size of the manufacturing facility smaller.

Next, sensor layer formation and upper electrode formation are carried out on the cut out TFT array cell 10A'. After formation is completed, a sealing process that covers the sensor layer and the upper electrodes with a glass substrate or resin or the like is carried out (see FIG. 9C).

Subsequently, the TFT array cell 10A' after the sealing process is subjected to secondary dividing. Up until this secondary dividing process, a short ring 120' is provided at the TFT array cell 10A' in order to protect the gate insulating films of TFT switches 4'. In this secondary dividing, the short ring 120' is separated from the TFT array cell 10A' and the respective terminals are electrically and physically separated (see FIG. 9D), in order to carry out TCP packaging in the next process.

Next, packaging of gate drivers and amp ICs (the packaging of ICs that are packaged on a TCP (tape carrier package)) is carried out on the TFT array cell 10A' from which the short ring 120' has been separated. Finally, the circuit substrates (a gate drive substrate, a signal detecting circuit substrate, and the like) are packaged, and the TFT active matrix substrate 10' is completed (see FIG. 9E).

Here, the short ring 120' is a line that connects the electrodes of the both ends of the insulating film in order to prevent application of voltage to the insulating film.

Namely, at the case of the above-described TFT array cell 10A', the final end portions of the data lines 3' and the scan lines 101' are connected by a metal line that is disposed at the peripheral edge of the array. Due thereto, even in a case in which charges are given to a given data line 3' due to static electricity or the like and the potential becomes high, the charges flow out immediately to the short ring 120', and voltage is thereby prevented from being applied to the insulating film.

Conversely, in a case in which there is no short ring 120' at the TFT array cell 10A', it is often the case that a strong electric field is applied to the insulating film due to static electricity, and due thereto, shifting of the characteristic of the TFT or dielectric breakdown (a leak defect) arises.

By providing the short ring 120' at the TFT array substrate 10B' in this way, the manufacturing yield of the TFT array cells 10A' can be maintained high, and therefore, the manufacturing cost can be kept low.

On the other hand, as shown in FIG. 9E, from after the secondary dividing up to the TCP packaging and circuit packaging, the input and output terminals of the TFT array cell 10A' are in completely electrically separated states. Therefore, because this is the same as a case in which there is no short ring 120', there is the concern that a shift in the characteristic or a dielectric breakdown defect will arise.

In order to prevent this, as shown in FIG. 6, it is usually the case that the bidirectional diodes 30' for protection are disposed between the respective data lines 3' and a common line 110' that is disposed at the peripheral edge of the active matrix array. Due thereto, charges can flow to the adjacent lines and electrostatic defects can be suppressed, although not to the extent as when the short ring 120' is used.

As a related art, Japanese Patent Application Laid-Open No. 10-177186 discloses a structure as follows: in a case in which a TFT active matrix substrate is used as the driving substrate of an LCD, a common line is formed so as to surround the display region. Bidirectional diodes for protection are formed between the common line and the respective data lines. Even in cases in which static electricity flies into the respective data lines, the static electricity is dispersed to the common line via the respective bidirectional diodes, and the TFT is thereby protected.

In a voltage controlling type device such as the LCD shown in Japanese Patent Application Laid-Open No. 10-177186, even when the common line 110' is formed and the bidirectional diodes 30' are inserted between the common line 110' and the respective data lines 3' and respective scan lines 101' as described above, there is no problem at all as an applied product. This is because an LCD is a voltage controlling type device that controls the voltages that are applied to the respective data lines 3' and the respective scan lines 101' of the TFT active matrix substrate.

Namely, in a case in which a potential difference arises between the respective data lines 3' at the time of actual driving, current flows via the bidirectional diodes 30'. However, the potentials of the respective data lines 3' are maintained because the resistance values of respective diodes 31' are sufficiently high with respect to the data lines 3'. Therefore, this structure is not an impediment in any way in an LCD in which the driving conditions are determined by voltage.

On the other hand, in an FPD as well, no problems arise with respect to the driving of the respective scan lines 101', in the same way as in an LCD. However, the data line 3' sides are signal detecting circuits (amp circuits) that detect charge amounts. Therefore, if, at the time of actual driving, a potential difference arises between the respective data lines 3' and leak current flows between the data lines, there is the problem that the signal values of the data lines, that are detected at a signal detecting circuit, fluctuate. Due thereto, there is the problem that false data information enters into the other data lines 3' and artifacts (false images) appear.

SUMMARY OF THE INVENTION

The present invention has been made in view of the above circumstances and provides an image detecting device in which electrostatic defects at the time of manufacturing the substrate can be prevented, and further, fluctuations in signal values due to leak current at the time of driving can be suppressed.

An aspect of the present invention provides an image detecting device that includes a substrate including plural accumulating portions in which, due to the irradiation of incident electromagnetic waves expressing an image which is an object of detection, charges expressing the image are accumulated; plural data lines to which the plural accumulating portions are respectively connected individually via switching elements; plural first protection lines for protecting a circuit from excess voltage; plural first diodes whose anodes are connected to a portion of the plural first protection lines respectively, and whose cathodes are connected to the plural data lines respectively; and plural second diodes whose cathodes are connected to another portion of the plural first protection lines respectively, and whose anodes are connected to the plural data lines respectively.

At the substrate, the plural accumulating portions in which, due to the irradiation of incident electromagnetic waves expressing an image which is an object of detection, charges expressing the image are accumulated, are individually connected to the plural data lines via switching elements.

Further, at the substrate, the anodes of the plural first diodes are connected to a portion of the plural first protection lines that are for protecting a circuit from excess voltage by discharging static electricity. The cathodes of the plural first diodes are connected to the plural data lines respectively. The cathodes of the plural second diodes are connected to another portion of the plural first protection lines respectively. The anodes of the plural second diodes are connected to the plural data lines respectively.

Accordingly, in accordance with the aspect, the static electricity that is generated at the respective data lines is discharged to the first protection lines respectively via the first diodes and the second diodes. Therefore, electrostatic defects at the time of manufacturing the substrate can be prevented. Further, the first protection lines at which the leak current flows differ in a case in which positive high voltage is applied to the respective data lines and in a case in which negative high voltage is applied. The leak current that has flowed in can be prevented from mixing into the other data lines via the first protection lines. Therefore, fluctuations in the signal values due to leak current at the time of driving can be suppressed.

BRIEF DESCRIPTION OF THE DRAWINGS

Embodiments of the present invention will be described in detail below on the basis of the drawings, wherein:

FIG. 15 is a linear sectional view of an indirect-conversion-type TFT active matrix substrate 10 relating to the third exemplary embodiment.

DETAILED DESCRIPTION OF THE INVENTION

Exemplary embodiments of the present invention will be described hereinafter with reference to the drawings. Note that description is given hereinafter of a case in which the present invention is applied to a radiation image detecting device 100 in which an X-ray sensitive layer is formed on a TFT active matrix substrate and which converts X-ray information directly into digital data.

First Exemplary Embodiment

Figure 1:
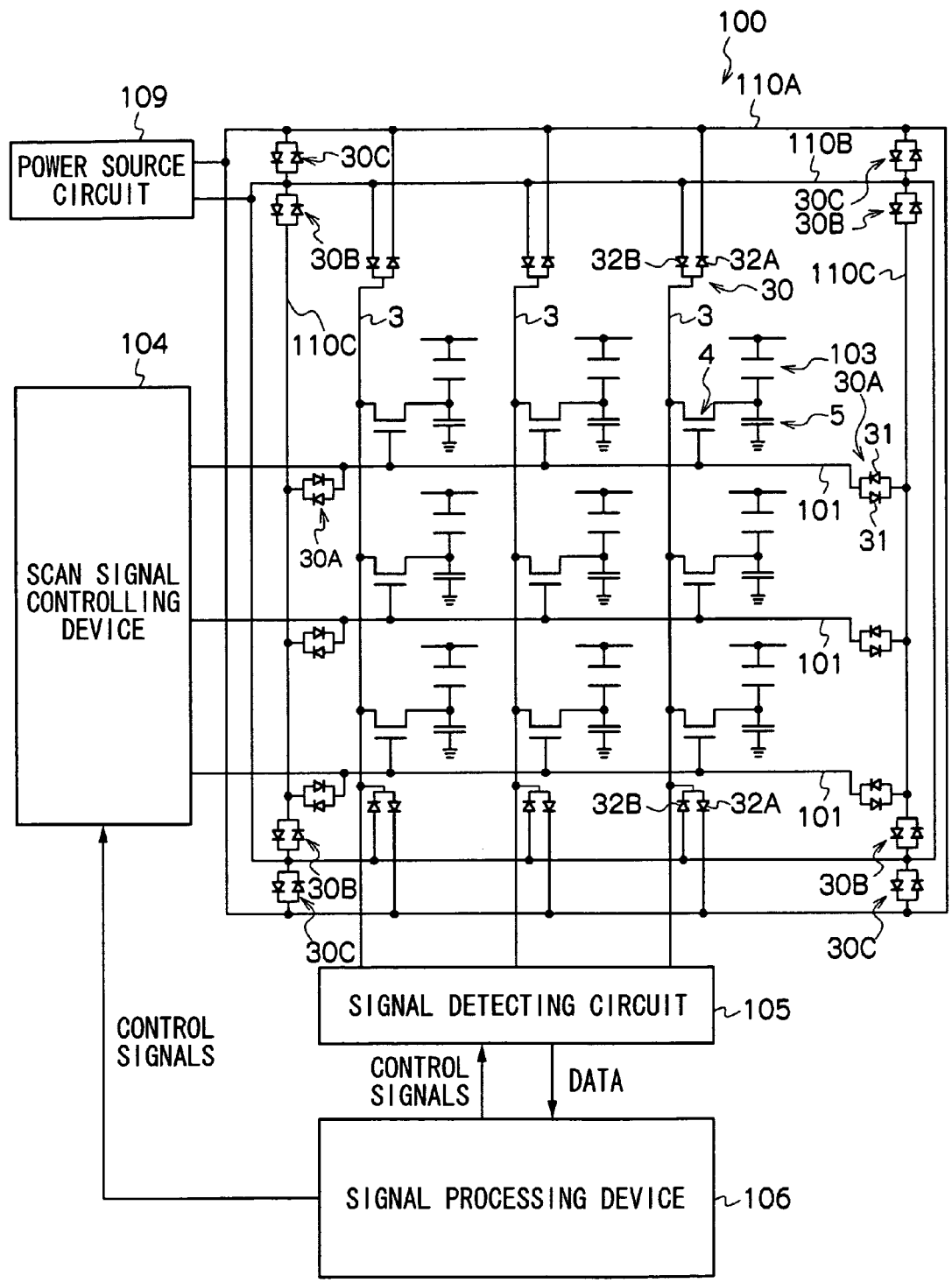
FIG. 1 is a structural drawing showing the overall structure of a radiation image detecting device relating to exemplary embodiments.

The overall structure of the radiation image detecting device 100 relating to the exemplary embodiments of the present invention is shown in FIG. 1.

As shown in FIG. 1, the radiation image detecting device 100 relating to the present exemplary embodiment has a TFT active matrix substrate 10.

A large number of pixels are provided in a two-dimensional form at the TFT active matrix substrate 10. The pixel is structured to include: an image sensor portion 103 structured from a bias electrode, a semiconductor film, and a charge collecting electrode that will be described later; a charge accumulating capacitor 5 that accumulates charge signals detected at the image sensor portion 103; and a TFT switch 4 for reading out the charges accumulated in the charge accumulating capacitor 5.

Plural scan lines 101 for turning the TFT switches 4 on and off, and plural data lines 3 for reading out the charges accumulated in the charge accumulating capacitors 5, are provided at the TFT active matrix substrate 10. One electrode of the charge accumulating capacitor 5 is grounded via an unillustrated line and made to be ground level. Note that, in FIG. 1 and in FIG. 4 that will be described later, the one electrode of the charge accumulating capacitor 5 is illustrated as being connected to ground.

At the TFT active matrix substrate 10, two common lines 110A, 110B are provided at the peripheral edge of the substrate so as to surround all of the pixels that are provided in the two-dimensional form.

The common lines 110A, 110B are respectively connected to a power source circuit 109, and respective predetermined voltages are applied thereto from the power source circuit 109.

Two diodes 32A, 32B are provided at each of the both end portions of each data line 3. The anodes of the respective diodes 32A and the cathodes of the respective diodes 32B are connected in parallel to the respective data lines 3. The cathodes of the respective diodes 32A are connected to the common line 110A, and the anodes of the respective diodes 32B are connected to the common line 110B.

A bidirectional diode 30A, that is structured such that the anodes and cathodes of two diodes 31 are respectively connected to one another in parallel, is provided at the both end portions of each of the scan lines 101. The respective scan lines 101 are connected to lines 110C via the bidirectional diodes 30A. Bidirectional diodes 30B are provided at the both ends of the lines 110C, and the respective lines 110C are connected to the common line 110B via the bidirectional diodes 30B.

Bidirectional diodes 30C are provided respectively at the four corner portions of the peripheral edge of the substrate. The common line 110A and the common line 110B are connected by the bidirectional diodes 30C at the four corner portions.

On the other hand, a signal detecting circuit 105 that detects, as electric signals, the charges that flow out to the data lines 3, is connected to the respective data lines 3. A scan signal controlling device 104, that outputs control signals for turning the TFT switches 4 on and off to the scan lines 101, is connected to the respective scan lines 101.

The signal detecting circuit 105 incorporates therein, for each of the data lines 3, an amplifying circuit 107 (see FIG. 4) that amplifies the voltage level of the inputted electric signal. Due to the signal detecting circuit 105 amplifying the electrical signals that are inputted from the respective data lines 3 and detecting the voltage levels of these electrical signals, the signal detecting circuit 105 detects the charge amounts accumulated in the respective charge accumulating capacitors 5 as information of the respective pixels structuring the image.

A signal processing device 106 is connected to the signal detecting circuit 105 and the scan signal controlling device 104. The signal processing device 106 carries out predetermined processings on the electrical signals detected at the signal detecting circuit 105, and outputs control signals expressing signal detecting timings to the signal detecting circuit 105, and outputs control signals expressing scan signal outputting timings to the scan signal controlling device 104.

Figure 2:
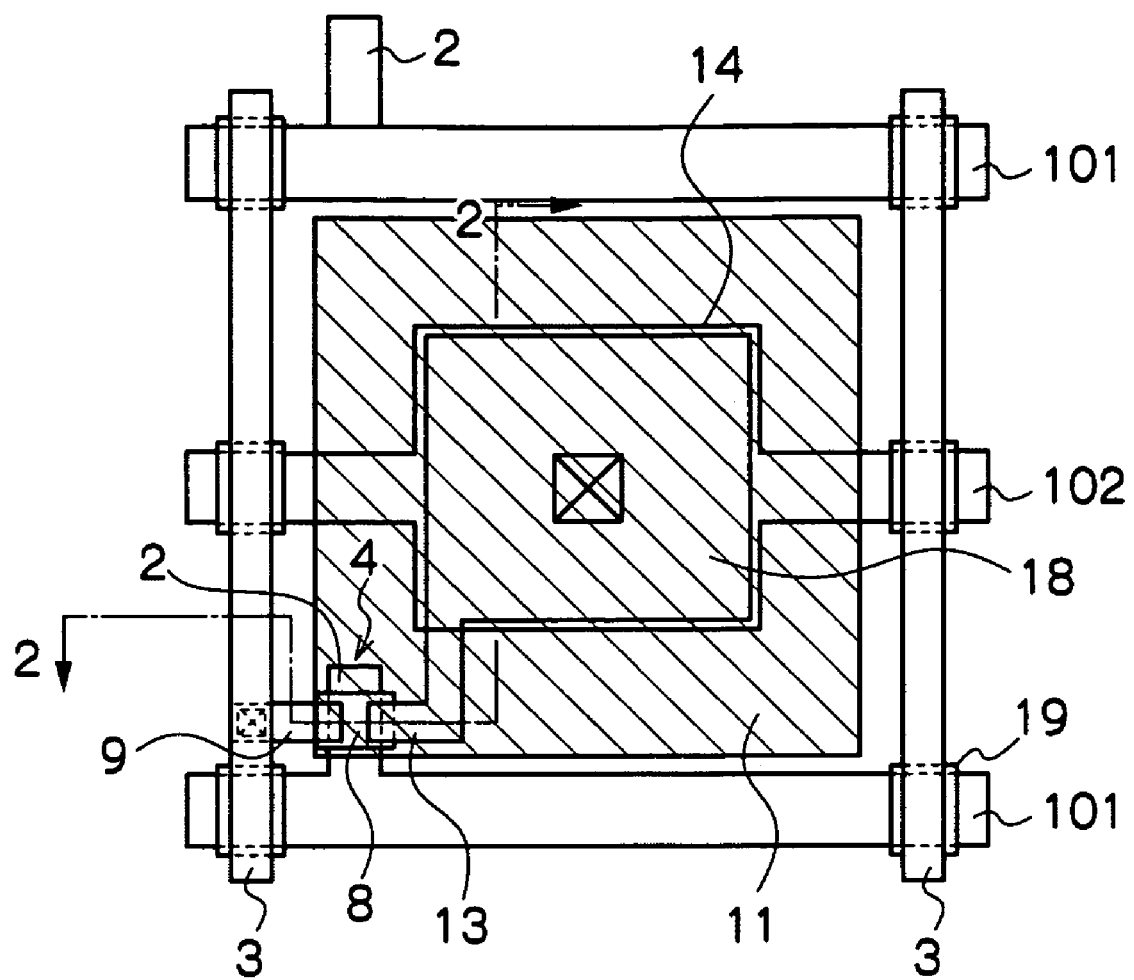
FIG. 2 is a plan view showing the structure of one pixel unit of a TFT active matrix substrate relating to the exemplary embodiments.

Next, the TFT active matrix substrate 10 relating to the present exemplary embodiment will be described in further detail with reference to FIG. 2 and FIG. 3. A plan view showing the structure of one pixel unit of the TFT active matrix substrate 10 relating to the present exemplary embodiment is shown in FIG. 2, and a sectional view along line 2-2 of FIG. 2 is shown in FIG. 3.

Figure 3:
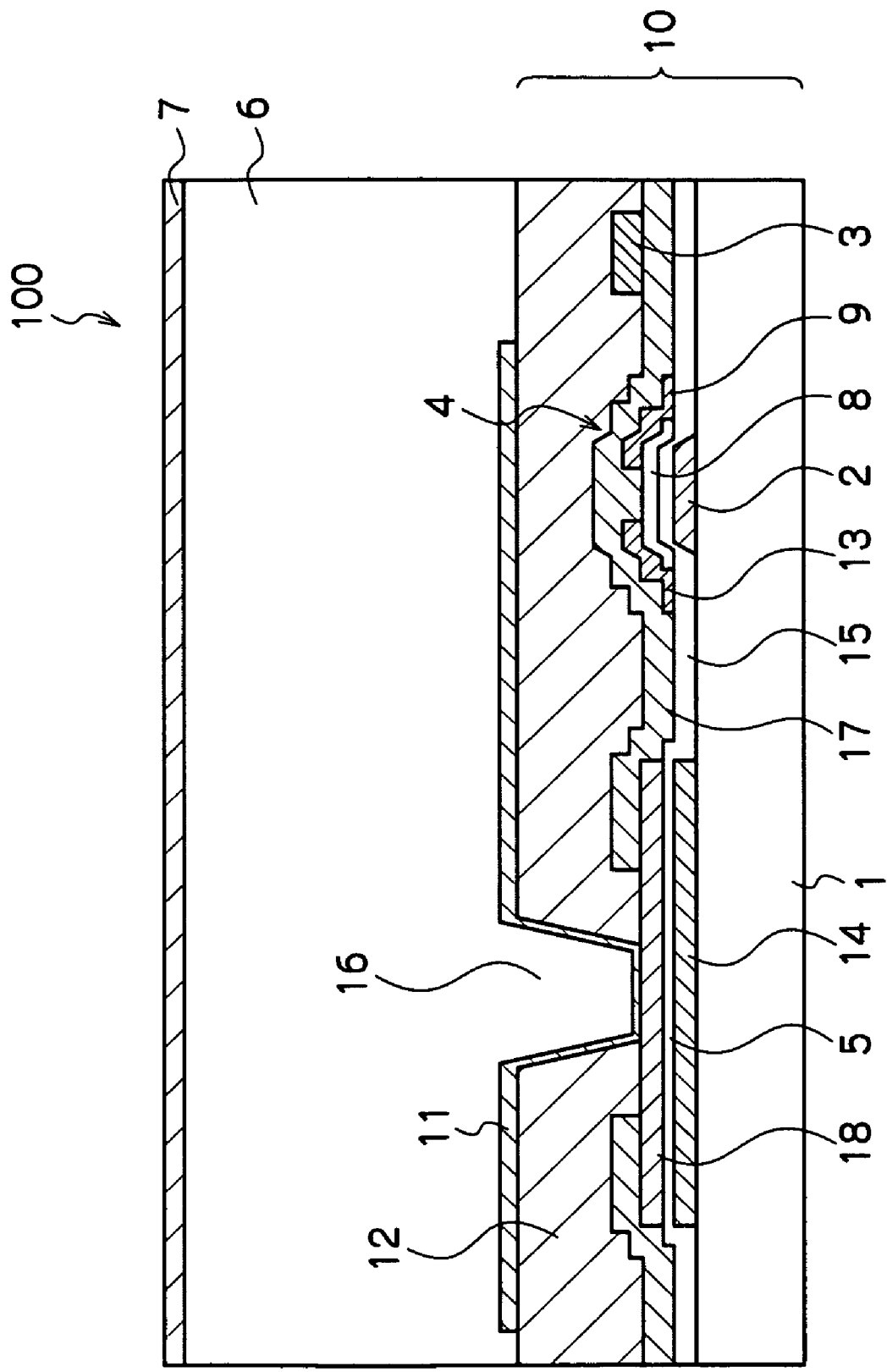
FIG. 3 is a sectional view along line 2-2 of FIG. 2 relating to the exemplary embodiments.

As shown in FIG. 3, the TFT active matrix substrate 10 relating to the present exemplary embodiment is structured such that a semiconductor film 6 that is electromagnetic wave conductive, and a bias electrode 7 that is connected to an unillustrated high voltage power source, are successively formed. The semiconductor film 6 generates charges (electrons-holes) at the interior thereof due to the irradiation of incident electromagnetic waves such as X-rays or the like. Namely, the semiconductor film 6 is electromagnetic wave conductive, and is for converting the image information of the X-rays into charge information. Further, the semiconductor film 6 is formed from, for example, amorphous a-Se (amorphous selenium) whose main component is selenium. Here, main component means having a content of greater than or equal to 50%.

The layer structure of the TFT active matrix substrate 10 relating to the present exemplary embodiment will be described in further detail hereinafter.

The TFT active matrix substrate 10 has a glass substrate 1, a gate electrode 2, an accumulating capacitor lower electrode 14, a gate insulating film 15, a semiconductor layer 8, a source electrode 9, a drain electrode 13, an accumulating capacitor upper electrode 18, an insulating protective film 17, the data lines 3, an interlayer insulating film 12, and a charge collecting electrode 11. Note that, as shown in FIG. 2, the scan line 101 is connected to the gate electrode 2, and the gate electrode 2 and the scan line 101 are formed from the same metal layer. Further, an accumulating capacitor line 102 is connected to the accumulating capacitor lower electrode 14, and the accumulating capacitor lower electrode 14 and the accumulating capacitor line 102 are formed from the same metal layer.

The TFT switch 4 is structured by the gate electrode 2, the gate insulating film 15, the source electrode 9, the drain electrode 13, the semiconductor layer 8, and the like. The charge accumulating capacitor 5 is structured by the accumulating capacitor lower electrode 14, the gate insulating film 15, the accumulating capacitor upper electrode 18, and the like.

The glass substrate 1 is a supporting substrate. For example, an alkaline-free glass substrate (e.g., #1737 manufactured by Corning Incorporated, or the like) can be used as the glass substrate 1. The scan lines 101 and the data lines 3 are electrode lines that are arrayed in the form of a grid as shown in FIG. 1. The TFT switches 4 are formed at the points of intersection thereof, as shown in FIG. 2. The TFT switch 4 is a switching element. The source electrode 9 thereof is connected to the data line 3 via a contact hole, and the drain electrode 13 is connected to the accumulating capacitor upper electrode 18.

The gate insulating film 15 is formed from $SiN_x$, $SiO_x$, or the like. The gate insulating film 15 is provided so as to cover the gate electrode 2, the scan line 101, the accumulating capacitor lower electrode 14 and the accumulating capacitor line 102. The region of the gate insulating film 15, which region is positioned above the gate electrode 2, functions as a gate insulating film at the TFT switch 4. The region of the gate insulating film 15, which region is positioned above the accumulating capacitor lower electrode 14, functions as a dielectric layer at the charge accumulating capacitor 5. Namely, the charge accumulating capacitor 5 is formed by the overlapping region of the accumulating capacitor upper electrode 18 and the accumulating capacitor lower electrode 14 that is formed at the same layer as the gate electrode 2.

The semiconductor layer 8 is the channel portion of the TFT switch 4, and is a current path connecting the source electrode 9, that is connected to the data line 3, and the drain electrode 13, that is connected to the accumulating capacitor upper electrode 18.

The insulating protective film 17 is formed over substantially the entire surface of the region (substantially the entire region) where the pixels are provided on the glass substrate 1. Due thereto, the insulating protective film 17 protects the drain electrode 13 and the source electrode 9, and aims for electrical insulation and separation. Further, the insulating protective film 17 has a contact hole 16 in the region positioned above the portion facing the accumulating capacitor lower electrode 14.

The charge collecting electrode 11 is formed from an amorphous, transparent, electrically-conductive oxide film. The charge collecting electrode 11 is formed so as to fill in the contact hole 16, and is layered above the source electrode 9 and the drain electrode 13, and above the accumulating capacitor upper electrode 18. The charge collecting electrode 11 and the semiconductor film 6 are electrically conductive, and the charges generated at the semiconductor film 6 can be collected at the charge collecting electrode 11.

The interlayer insulating film 12 is formed from an acrylic resin that is photosensitive, and aims for electrical insulation and separation of the TFT switch 4. The contact hole 16 passes through the interlayer insulating film 12, and the charge collecting electrode 11 is connected to the accumulating capacitor upper electrode 18 via the contact hole 16.

The gate electrode 2, the scan line 101, the accumulating capacitor lower electrode 14 and the accumulating capacitor line 102 are provided on the glass substrate 1. The semiconductor layer 8 is formed above the gate electrode 2, via the gate insulating film 15. The source electrode 9 and the drain electrode 13 are formed on the semiconductor layer 8. The accumulating capacitor upper electrode 18 is layered above the layer that structures the charge accumulating capacitor 5. Further, the insulating protective film 17 is disposed above the accumulating capacitor upper electrode 18, the source electrode 9 and the drain electrode 13.

The data line 3 is disposed above the insulating protective film 17. The interlayer insulating film 12 is provided above the insulating protective film 17 and the data line 3. The charge collecting electrode 11 is provided at the top layer of the interlayer insulating film 12, i.e., at the uppermost layer of the TFT active matrix substrate 10. The charge collecting electrode 11 and the TFT switch 4 are connected via the accumulating capacitor upper electrode 18 and the drain electrode 13.

An unillustrated high voltage power source is connected between the bias electrode 7 and the accumulating capacitor lower electrode 14.

Next, the principles of operation of the radiation image detecting device 100 having the above-described structure will be explained simply.

When X-rays are irradiated onto the semiconductor film 6 in a state in which voltage is applied between the bias electrode 7 and the accumulating capacitor lower electrode 14, charges (electron-hole pairs) are generated within the semiconductor film 6. The semiconductor film 6 and the charge accumulating capacitor 5 are structured so as to be electrically connected in series. Therefore, the electrons generated within the semiconductor film 6 move toward the positive electrode side and the holes move toward the negative electrode side, and as a result, charges are accumulated in the charge accumulating capacitor 5.

Due to the TFT switch 4 being turned on by an input signal to the scan line 101, the charges accumulated in the charge accumulating capacitor 5 can be removed to the exterior via the data line 3.

Further, the scan lines 101 and the data lines 3, and the TFT switches 4 and the charge accumulating capacitors 5, are all provided in the form of an XY matrix. Therefore, the image information of the X-rays can be obtained two-dimensionally due to the signals inputted to the scan lines 101 being successively scanned and the signals from the data lines 3 being sensed per data line 3.

At the TFT active matrix substrate 10 relating to the present exemplary embodiment, in order to prevent electrostatic breakage at the time of manufacturing an FPD, the respective data lines 3 are connected to the common line 110A via the diodes 32A and are connected to the common line 110B via the diodes 32B, and the respective scan lines 101 are connected to the common lines 110A, 110B via the bidirectional diodes 30A, the lines 110C and the bidirectional diodes 30C.

Due thereto, in a case in which positive high voltage is applied to the respective data lines 3 due to static electricity or the like, current flows to the common line 110A via the diodes 32A. In a case in which negative high voltage is applied to the respective data lines 3 due to static electricity or the like, current flows from the common line 110B via the diodes 32B. High voltage is thereby prevented from being applied to the insulating film.

Further, in a case in which positive or negative high voltage is applied to the respective scan lines 101 due to static electricity or the like, current flows to the common line 110B via the bidirectional diodes 30A, the lines 110C and the bidirectional diodes 30C. High voltage is thereby prevented from being applied to the insulating film.

On the other hand, at the data lines 3, at the time of actual driving, due to static electricity or due to charges that are greater than or equal to those supposed in advance being accumulated in the charge accumulating capacitors 5, there are cases in which a potential difference arises between the respective data lines 3, and leak current flows from the respective data lines 3 to the common line 110A.

However, in the TFT active matrix substrate 10 relating to the present exemplary embodiment, the common line is divided into the two lines that are the common lines 110A, 110B. The line at which the leak current flows is made to differ in the case in which positive high voltage is applied to the respective data lines 3 and in the case in which negative high voltage is applied. Therefore, fluctuations in the signal values due to leak current at the time of driving can be suppressed.

Figure 4:
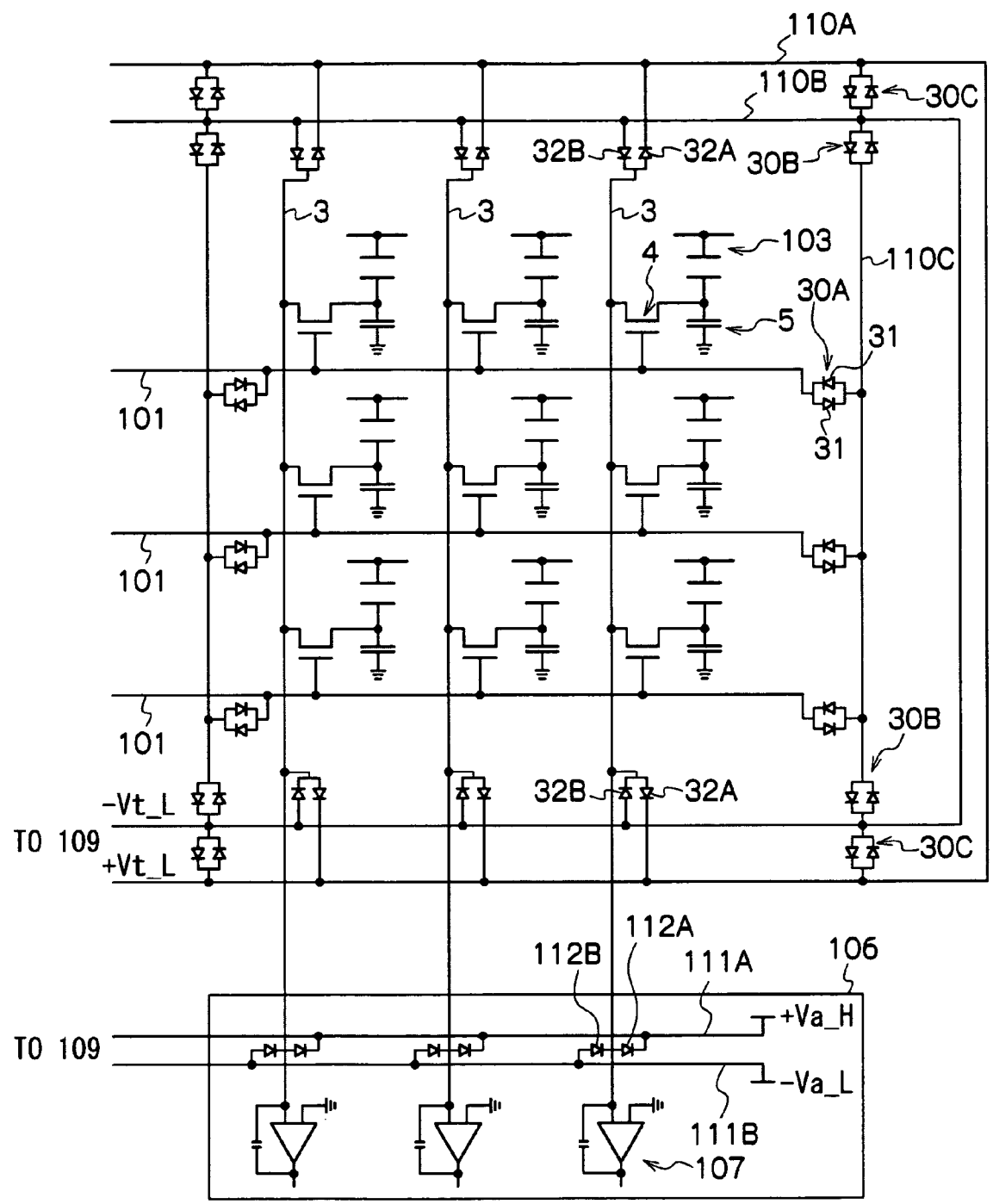
FIG. 4 is a structural drawing showing the overall structure of a TFT active matrix substrate relating to a first exemplary embodiment.

Further, in the radiation image detecting device 100 relating to the present exemplary embodiment, as shown in FIG. 4, at the signal detecting circuit 105, two diodes 112A, 112B are provided for each of the data lines 3, and two common lines 111A, 111B are provided as lines for discharging current and protecting the circuit. The anodes of the respective diodes 112A are connected to the data lines 3 respectively, and the cathodes of the respective diodes 112A are connected to the common line 111A. The cathodes of the respective diodes 112B are connected to the data lines 3 respectively, and the anodes of the respective diodes 112B are connected to the common line 111B.

These two common lines 111A, 111B are connected to the power source circuit 109 via unillustrated lines. Predetermined voltages are respectively applied from the power source circuit 109 to the common lines 111A, 111B.

Here, in the radiation image detecting device 100 relating to the present exemplary embodiment, respective predetermined voltages are applied from the power source circuit 109 to the common line 110A and the common line 111A, in order for the driving voltage of the diodes 32A, to which leak current flows out at the diodes 32A, to be made higher than the driving voltage of the diodes 112A, to which leak current flows out at the diodes 112A. Further, respective predetermined voltages are applied from the power source circuit 109 to the common line 110B and the common line 111B, in order for the driving voltage of the diodes 32A, to which leak current flows out at the diodes 32A, to be made higher than the driving voltage of the diodes 112A, to which leak current flows out at the diodes 112A.

Figure 5:
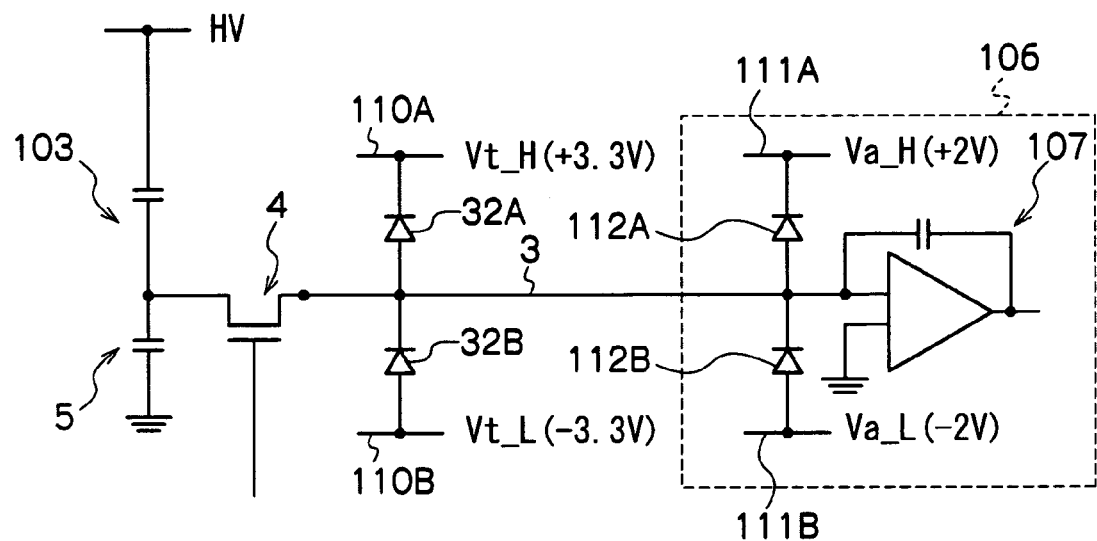
FIG. 5 is a circuit diagram showing an equivalent circuit and focusing on one pixel of the TFT active matrix substrate relating to the first exemplary embodiment.

An equivalent circuit diagram that focuses on one pixel of the TFT active matrix substrate 10 relating to the present exemplary embodiment is shown in FIG. 5.

Here, for example, in a case in which the characteristics of the diodes 32A, 32B, the diodes 112A, 112B are the same, for example, voltage of VT_H=+3.3 V is applied from the power source circuit 109 to the common line 110A, and voltage of VT_L=−3.3 V is applied to the common line 110B. On the other hand, voltage of Va_H=+2 V is applied to the common line 111A, and voltage of Va_L=−2 V is applied to the common line 111B.

Due thereto, the potential of the common line 111A is lower than that of the common line 110A, and therefore, leak current flows from the diodes 112A before leak current flows from the diodes 32A. The potential of the respective data lines 3 can thereby be prevented from becoming high, and as a result, charges no longer flow via the diodes 32A of the TFT active matrix substrate 10. Thus, fluctuations in the signal values due to leak current at the time of driving can be suppressed.

Generally, the TFT active matrix substrate 10 is large at about 30 cm square, and the wiring load (R, C) is large. Therefore, time is required until the charges, that have flowed to the common lines on the TFT active matrix substrate 10, flow to GND or a power source installed on an external circuit. During this time, for example, the potentials of the common lines rise, and due thereto, it is often the case that a new leak path is formed or the TFT switches 4 malfunction.

On the other hand, in accordance with the present exemplary embodiment, at the common lines 111A, 111B of the signal detecting circuit 105, generally, the wiring load to the power source or GND is small. Therefore, these problems can be mitigated.

As described above in detail, in accordance with the present exemplary embodiment, the static electricity that arises at the respective data lines 3 at the time of manufacturing the TFT active matrix substrate 10 is discharged to the common lines 110A, 110B respectively via the diodes 32A, 32B. Therefore, electrostatic defects at the time of manufacturing the substrate can be prevented.

At the TFT active matrix substrate 10, the common line is provided so as to be divided into two lines that are the common line 110A, to which leak current flows in a case in which positive high voltage is applied to the respective data lines 3, and the common line 110B, to which leak current flows in a case in which negative high voltage is applied. Therefore, the current, that has flowed in once to the common line 110A, does not mix into the other data lines 3 via the common line 110B. Further, leak current flows from the diodes 112A before leak current flows from the diodes 32A, and the potentials of the respective data lines 3 are prevented from becoming high. Therefore, fluctuations in the signal values due to leak current at the time of driving can be suppressed.

In accordance with the present exemplary embodiment, because the two common lines 110A, 110B are connected by the bidirectional diodes 30C, current flows at the time of manufacturing the TFT active matrix substrate 10, and as a result, the effects are the same as inserting bidirectional diodes between the data lines 3 and the scan lines 101. On the other hand, due to the common lines 110A, 110B being connected to different power source potentials or GND at the time of actual driving, the common lines 110A, 110B can be separated electrically. Namely, as compared with the wiring resistance of the common lines which is on the order of several KΩ, the resistance value of the bidirectional diodes is large on the order of several MΩ. Therefore, by connecting to a power source, leak current does not leak to different data lines via the bidirectional diodes.

Second Exemplary Embodiment

The structure of the radiation image detecting device 100 and the structure of the TFT active matrix substrate 10 relating to a second exemplary embodiment are the same as in the above-described first exemplary embodiment (see FIGS. 1 through 3), and therefore, description thereof is omitted here.

At the TFT active matrix substrate 10 relating to the present exemplary embodiment, the resistance value of the common lines 110A, 110B is made to be smaller than the resistance value of the bidirectional diodes 30B by, for example, adjusting the members or the line widths of the common lines 110A, 110B, or adjusting the film thicknesses or the members of the respective layers structuring the bidirectional diodes 30B. In the present exemplary embodiment, given that the resistance value of the common lines 110A, 110B is Ro and that the resistance value of the bidirectional diodes 30B is Rd, the common lines 110A, 110B and the bidirectional diodes 30B are formed such that the value of Rd/Ro is greater than or equal to 1000 (the ratio Ro:Rd is greater than or equal to 1:1000).

Next, operation of the radiation image detecting device 100 of the above-described structure will be explained.

At the TFT active matrix substrate 10 relating to the present exemplary embodiment, by making the resistance value of the common lines 110A, 110B smaller than the resistance value of the bidirectional diodes 30B, of the leak current that flows out to the common line 110A and the common line 111A from any of the data lines 3, the feedback current that is fed back to the other data lines 3 can be made to be small.

Figure 10:
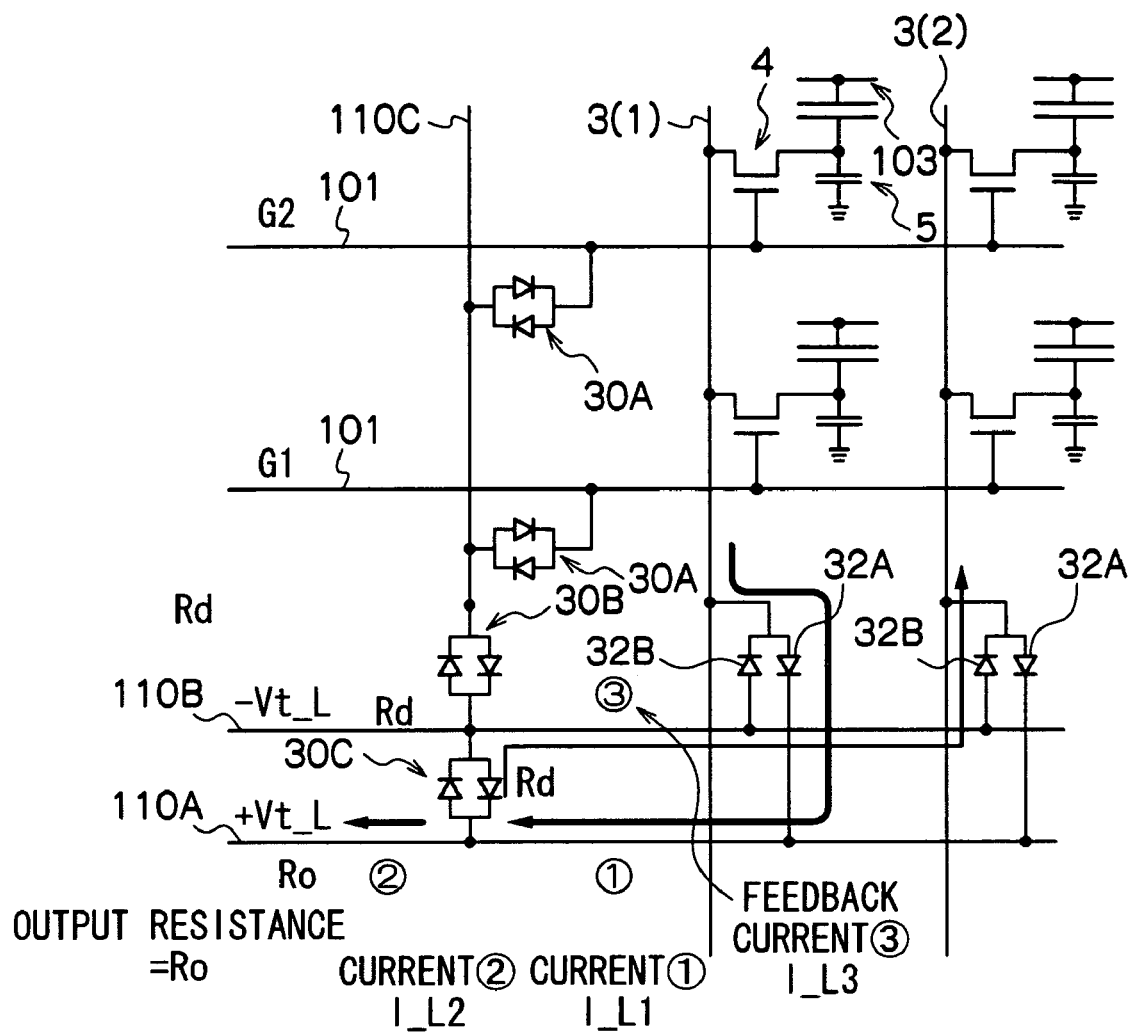
FIG. 10 is an enlarged view showing, in an enlarged manner, a TFT active matrix substrate 10 relating to a second exemplary embodiment.

FIG. 10 is a circuit diagram in which the TFT active matrix substrate 10 relating to the present exemplary embodiment is shown in an enlarged manner and the flow of current is shown by arrows. Note that the thicknesses of the arrows in FIG. 10 express the magnitudes of the current values.

For example, in a case in which high positive voltage is applied due to static electricity or the like to data line 3(1) and leak current I_L1 flows through the common line 110A via the diode 32A, the leak current I_L1 flows to the common line 110A and leak current I_L2 flows to the power source circuit 109, and feedback current I_L3 flows to other data lines 3(2) via the bidirectional diodes 30B and the common line 110B.

This feedback current I_L3 is determined from following formula (1).

$$I\_L3 = Rd/(Ro+Rd) \times I\_L1 \qquad (1)$$

For example, if the ratio Ro:Rd is made to be 1:1000, the feedback current I_L3 is less than or equal to ¹⁄₁₀₀₀ of the current I_L1.

Accordingly, due to a structure such as that of the present exemplary embodiment, even in a case in which leak current arises at any of the data lines 3, fluctuations in the signal values due to leak current to the other data lines 3 can be suppressed.

Figure 6:
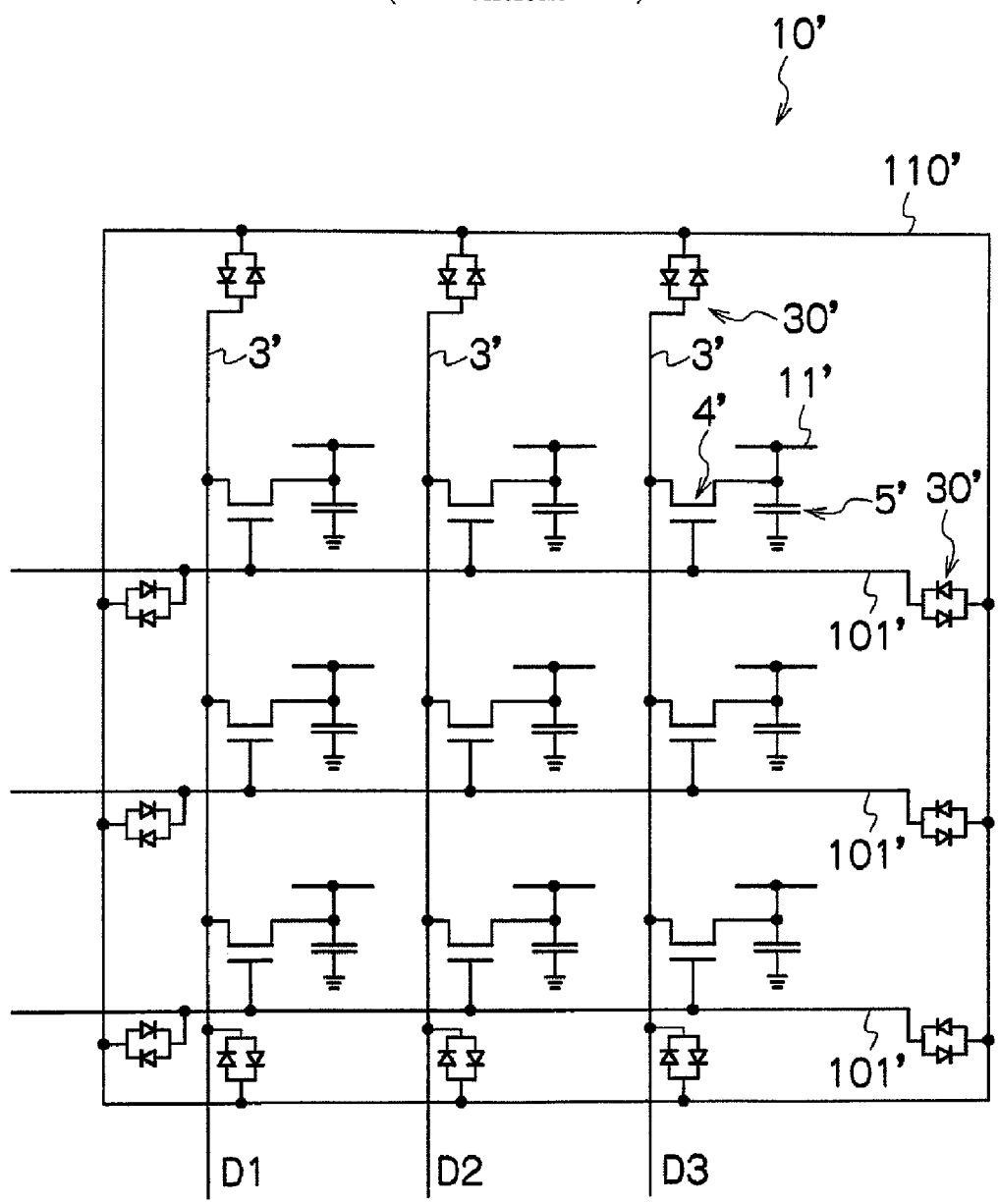
FIG. 6 is a structural drawing showing the structure of a conventional TFT active matrix substrate.
Figure 7:
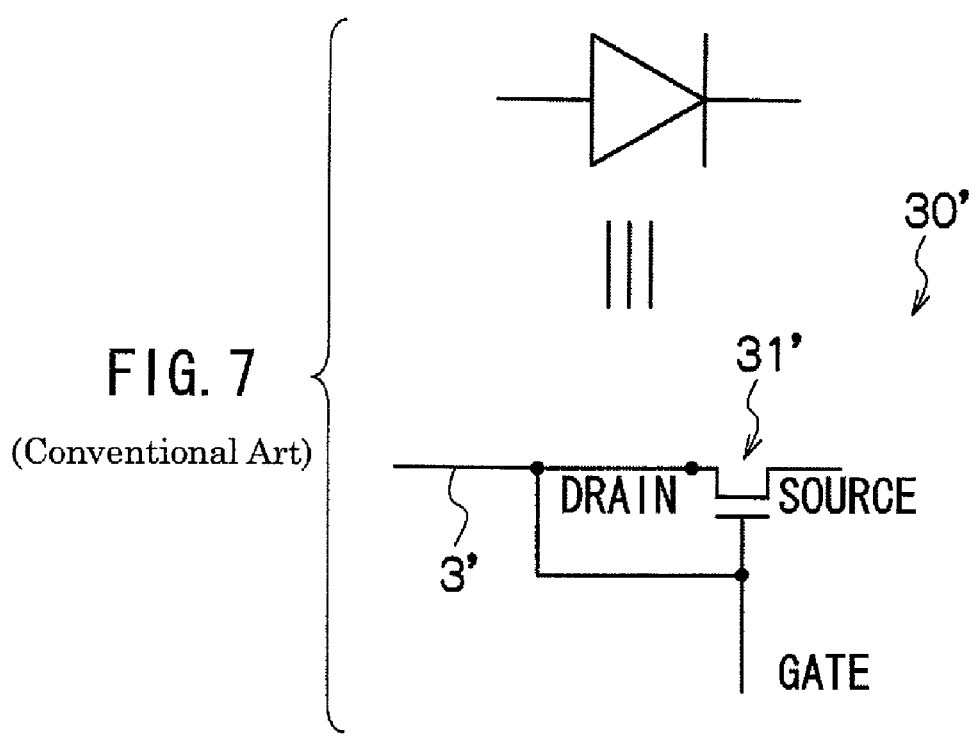
FIG. 7 is a structural drawing showing the structure of one diode structuring a conventional bidirectional diode.
Figure 8:
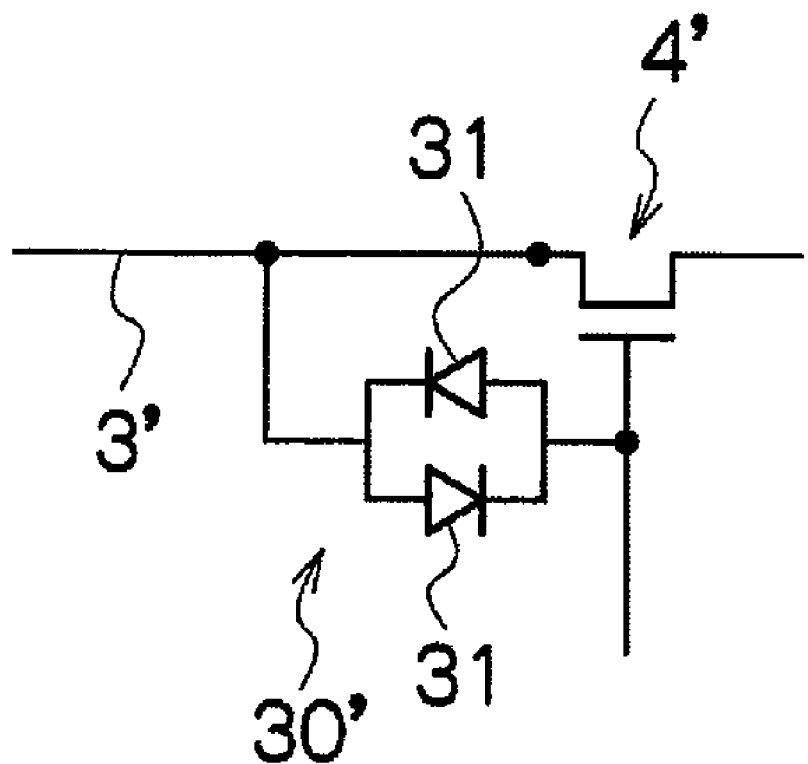
FIG. 8 is a circuit diagram showing an equivalent circuit and focusing on one TFT element of the conventional TFT active matrix substrate.
Figure 9A:
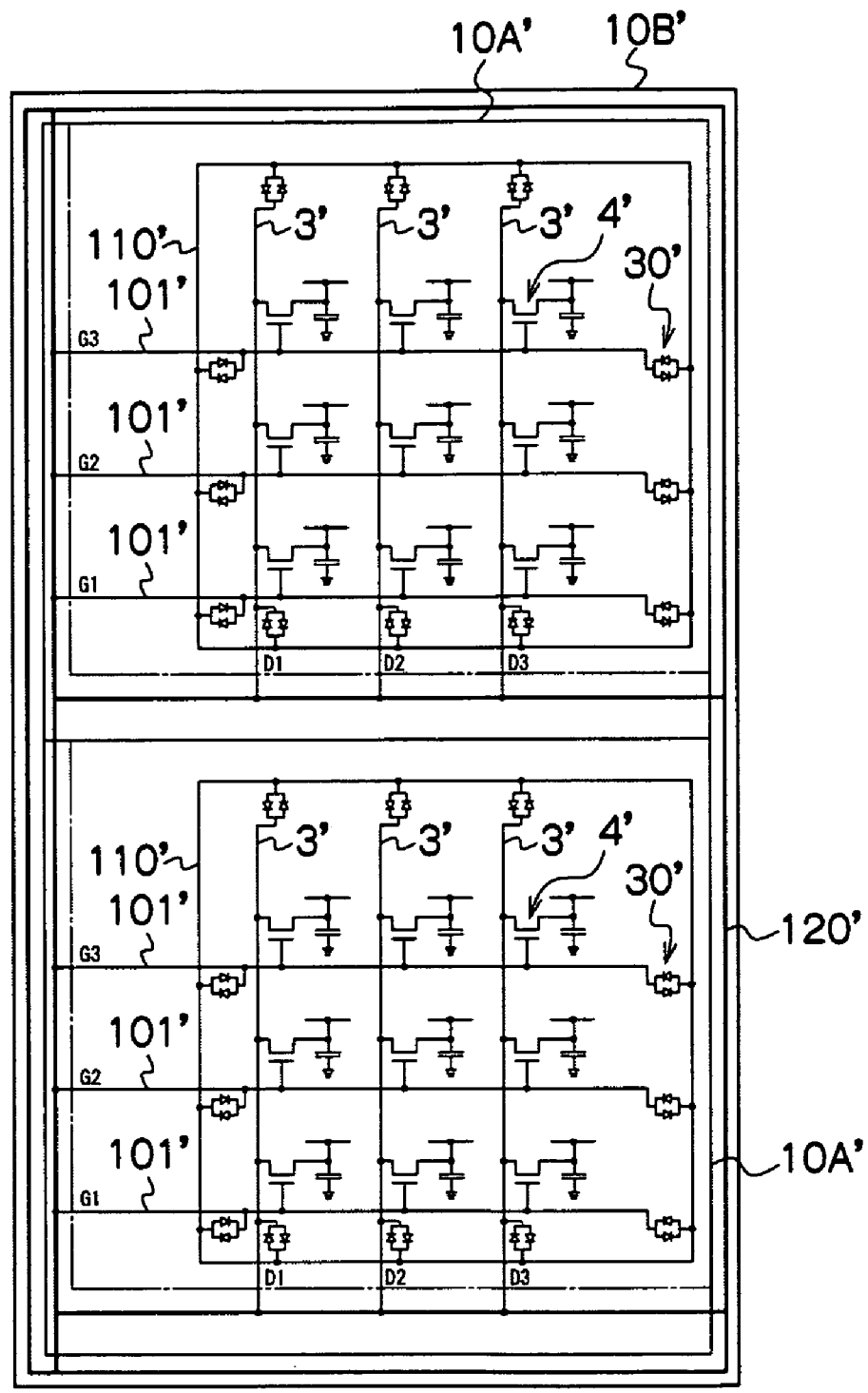
FIG. 9A through 9E are schematic diagrams showing respective manufacturing steps of a TFT active matrix substrate.
Figure 9B:
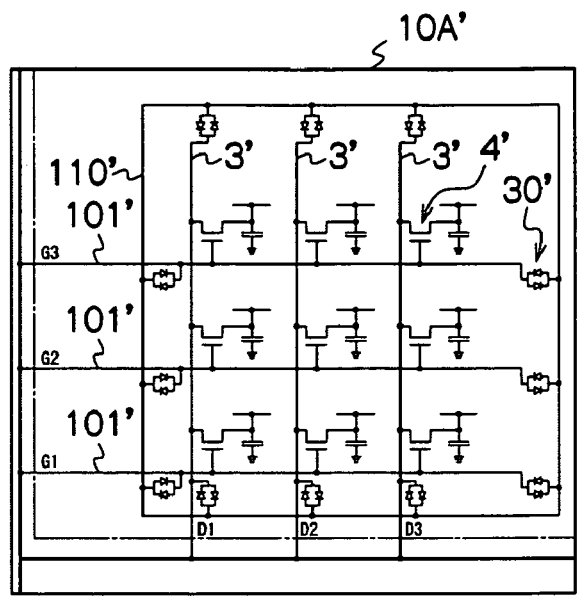
Figure 9C:
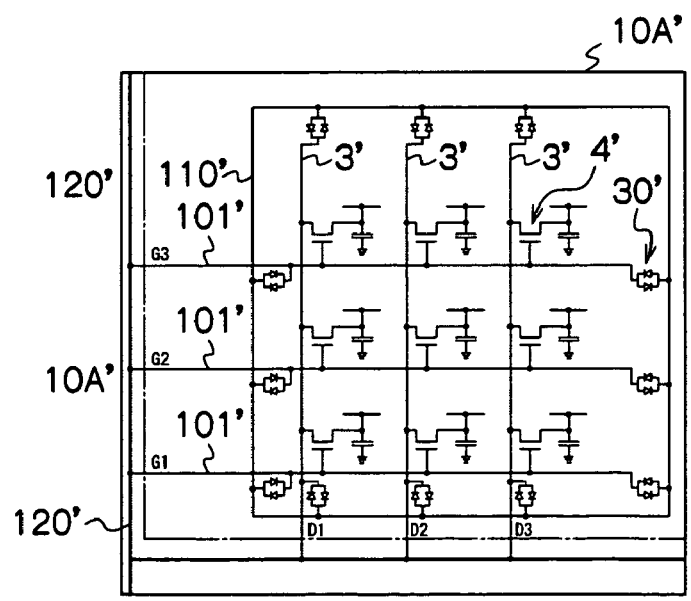
Figure 9D:
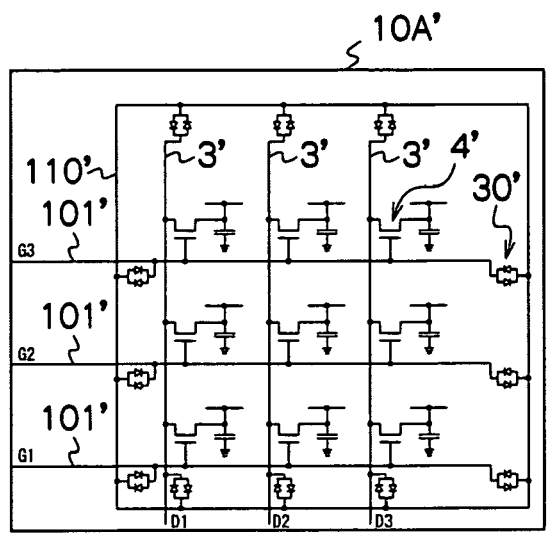
Figure 9E:
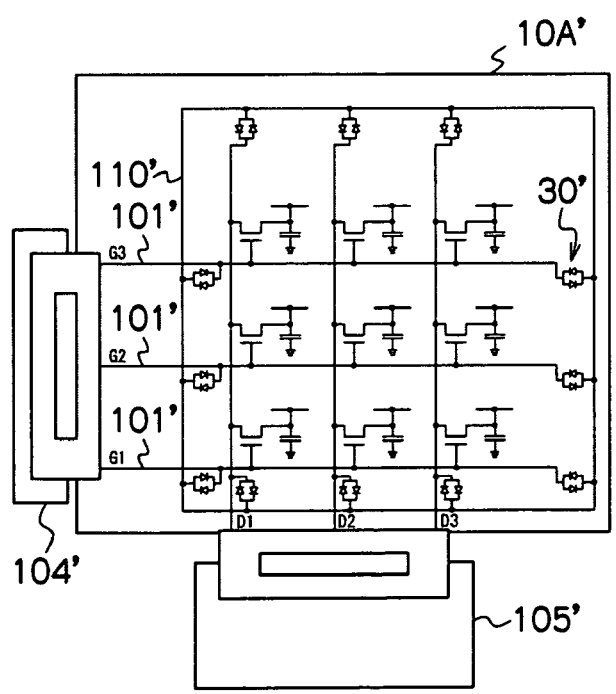
Figure 11:
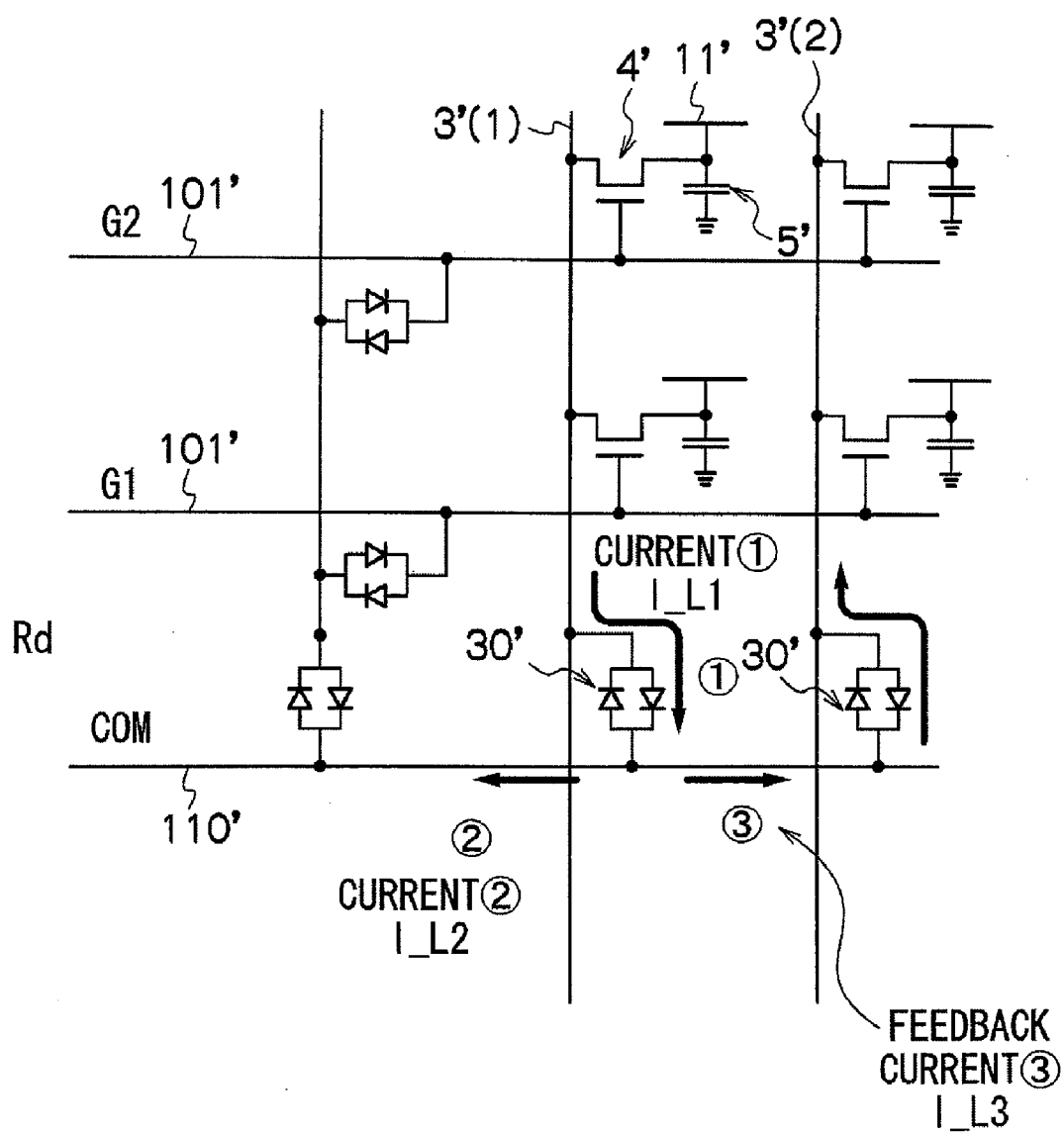
FIG. 11 is an enlarged view showing, in an enlarged manner, a conventional TFT active matrix substrate 10.

On the other hand, FIG. 11 is a circuit diagram in which the TFT active matrix substrate 10' of the conventional art illustrated in FIG. 6 is shown in an enlarged manner and the flow of leak current is shown by arrows. Note that the thicknesses of the arrows in FIG. 11 express the magnitudes of the current values.

For example, in a case in which the leak current I_L1 flows from data line 3'(1) to the common line 110' via the bidirectional diode 30', the current I_L2 flows to the common line 110', and the feedback current I_L3 flows to other data lines 3'(2) via the bidirectional diodes 30' and the common line 110'.

This feedback current I_L3 is determined from following formula (2).

$$I\_L3 = \tfrac{1}{2} \times I\_L1 \qquad (2)$$

Accordingly, at the TFT active matrix substrate 10' of the conventional art illustrated in FIG. 6, in a case in which leak current arises at any of the data lines 3', the leak current flows between the data lines, and the signal values of the data lines detected at the signal detecting circuit fluctuate greatly.

As described above in detail, in accordance with the present exemplary embodiment, by making the resistance value of the common lines 110A, 110B be smaller than the resistance value of the bidirectional diodes 30B, of the leak current that flows out from any of the data lines 3, the feedback current that is fed back to the other data lines 3 can be made to be small. Therefore, fluctuations in the signal values due to leak current at the time of driving can be suppressed.

Note that, in the second exemplary embodiment, in the same way as in the first exemplary embodiment, a case is described in which the voltage VT_H is applied to the common line 110A from the power source circuit 109, and the voltage VT_L is applied to the common line 110B. However, similar effects can be obtained even if voltages of the same voltage level are applied to the common lines 110A, 110B from the power source circuit 109. Further, similar effects can be obtained even if either one of the common lines 110A, 110B is connected to a ground line and the other is not connected.

Third Exemplary Embodiment

The radiation image detecting device 100 relating to a third exemplary embodiment is the same as in the above-described first exemplary embodiment (see FIG. 1), and is further provided with blocking films that block the electric field that is due to charges generated by X-rays.

Figure 12:
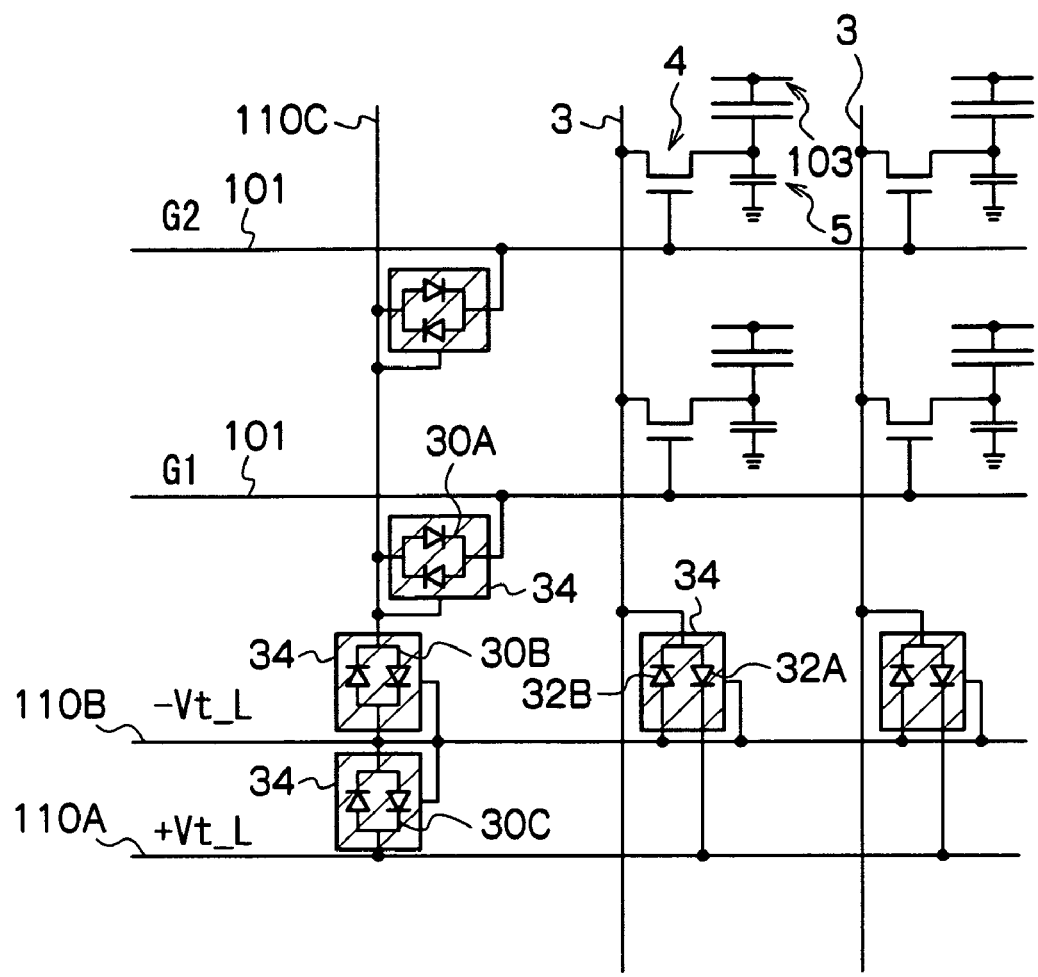
FIG. 12 is an enlarged view showing, in an enlarged manner, a direct-conversion-type TFT active matrix substrate 10 relating to a third exemplary embodiment.

A circuit diagram, in which the TFT active matrix substrate 10 relating to the present exemplary embodiment is enlarged, is illustrated in FIG. 12. Note that portions in FIG. 12 that are the same as in FIG. 1 are denoted by the same reference numerals, and description thereof is omitted.

As shown in FIG. 12, at the TFT active matrix substrate 10, blocking films 34, that block electric field due to charges generated by X-rays, are provided at the diodes 32A, 32B and the bidirectional diodes 30A, 30B, 30C so as to not intersect the data lines 3 and the scan lines 101. The blocking films 34 provided at the bidirectional diodes 30A are connected to the lines 110C. The blocking films 34 respectively provided at the diodes 32A, 32B and the bidirectional diodes 30B, 30C are connected to the common line 110B.

Figure 13:
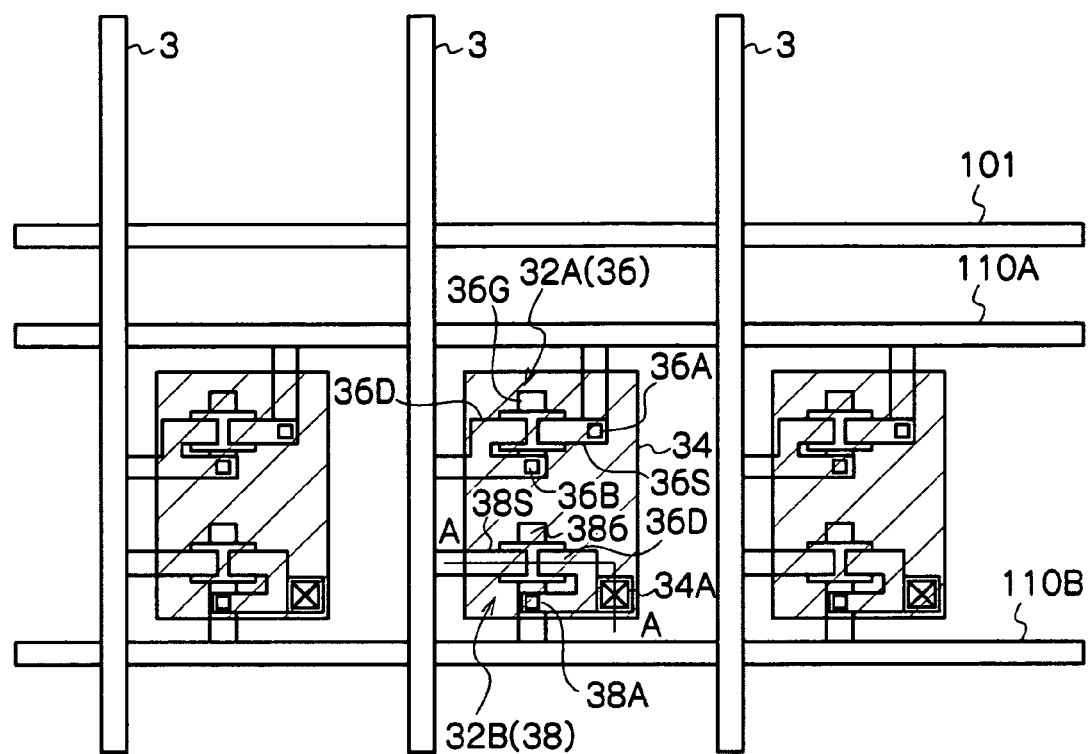
FIG. 13 is a plan view showing detailed structures of diodes 32A, 32B relating to the third exemplary embodiment.
Figure 14:
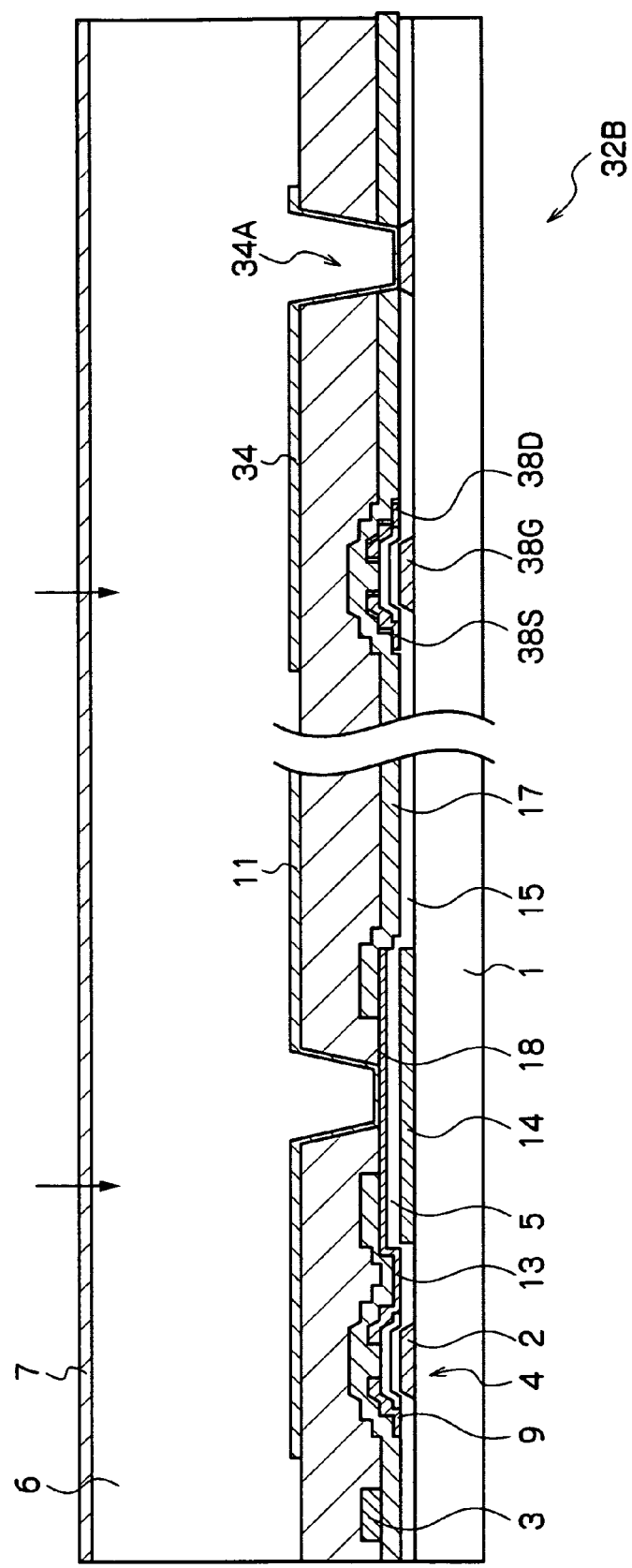
FIG. 14 is a linear sectional view of the direct-conversion-type TFT active matrix substrate 10 relating to the third exemplary embodiment.

The diodes 32A, 32B will be described in detail next with reference to FIG. 13 and FIG. 14. A plan view showing the structure of the diodes 32A, 32B is shown in FIG. 13, and a sectional view along line A-A of FIG. 13 is shown at the right side of FIG. 14. Note that a sectional view of the pixel portion is shown at the left side of FIG. 14, for comparative explanation of the layer structures.

The diode 32A (see FIG. 13) is structured by connecting a drain electrode 36D of a TFT switch 36 to the data line 3, and connecting a source electrode 36S to the common line 110B via a contact hole 36A, and further, connecting a gate electrode 36G and the drain electrode 36D via a contact hole 36B.

The diode 32B is structured by connecting a source electrode 38S of a TFT switch 38 to the data line 3, and connecting a drain electrode 38D to the common line 110A via a contact hole 38A, and further, connecting a gate electrode 38G and the drain electrode 38D. On the other hand, the blocking film 34 (see FIG. 14) is formed by the same member and at the same layer as the charge collecting electrode 11. The blocking film 34 is connected to the common line 110B by being connected to a drain electrode 38A via a contact hole 34A.

Operation of the radiation image detecting device 100 having the above-described structure will be described next.

At the diodes 32A, 32B and the bidirectional diodes 30A, 30B, 30C, when X-rays are incident, there are cases in which, due to the electric field caused by the X-rays, the leak current that flows increases and the wiring resistance that should be ensured originally cannot be maintained.

Here, at the TFT active matrix substrate 10 relating to the present exemplary embodiment, the blocking films 34 are provided at the X-ray incident sides of the diodes 32A, 32B and the bidirectional diodes 30A, 30B, 30C. Due thereto, incidence of the X-rays on the diodes 32A, 32B and the bidirectional diodes 30A, 30B, 30C is suppressed, and therefore, the wiring resistance that should be ensured originally can be maintained.

Note that the present exemplary embodiment describes a case that is applied to the direct-conversion-type radiation image detecting device 100 that converts X-rays directly into charges at the semiconductor film 6 and accumulates the charges. However, the present invention may be applied to the indirect-conversion-type radiation image detecting device 100 in which radiation is once converted into light at a scintillator of CsI:Tl, GOS ($Gd_2O_2S$:Tb) or the like, and the converted light is converted into charges at a semiconductor layer and the charges are accumulated.

In the case of the indirect-conversion-type, leak current at the diodes 32A, 32B and the bidirectional diodes 30A, 30B, 30C increases more due not only to electric field, but also due to incidence of the light generated at the scintillator. Therefore, as in the present exemplary embodiment, it is effective to provide, at the light incident sides, the blocking films 34 that are formed from a material that cuts off the generated light of the scintillator and that is electrically conductive.

A sectional view of the pixel portion in the case of an indirect-conversion-type device is shown at the left side of FIG. 15, and a sectional view of the diode 32A in the case of an indirect-conversion-type device is shown at the right side.

In the indirect-conversion-type radiation image detecting device 100, radiation is converted into light at a scintillator 40, and the converted light is converted into charges at the semiconductor film 6, and the charges are collected and accumulated at the charge collecting electrode 11. At the indirect-conversion-type radiation image detecting device 100, because radiation is converted into light at the scintillator 40, leak current does not increase if a protective circuit for circuit protection (the common lines 110A, 110B, the diodes 32A, 32B, the bidirectional diodes 30A, 30B, 30C) is not disposed in a vicinity of the scintillator 40. However, in order to make the TFT active matrix substrate 10 more compact, it is desirable to make the peripheral region as narrow as possible.

At the indirect-conversion-type radiation image detecting device 100, the panel is manufactured by affixing the scintillator 40, that is prepared separately, with the TFT active matrix substrate 10 by an adhesive member 42. Therefore, for example, in a case in which the margin for affixing the scintillator 40 is set at about 1 to 5 mm at one side of the TFT active matrix substrate 10, it is not preferable to place the protective circuit for circuit protection at the peripheral region of about 3 to 8 mm of the TFT active matrix substrate 10. However, by providing the blocking films 34 as in the present exemplary embodiment, the protective circuit can be disposed at the peripheral region, and therefore, the TFT active matrix substrate 10 can be made to be compact.

As described above in detail, in accordance with the present exemplary embodiment, by providing the blocking films 34 at the X-ray incident sides of the diodes 32A, 32B and the bidirectional diodes 30A, 30B, 30C and keeping the leak current small, fluctuations in the signal values due to leak current at the time of driving can be suppressed.

Note that the first exemplary embodiment describes a case in which negative voltage is applied respectively to the common line 110B and the common line 111B, but the present invention is not limited to the same. For example, in the case of an image detecting device in which only positive charges are generated at the charge accumulating capacitors 5, voltage is not applied to the minus side. Therefore, by connecting the common line 110B and the common line 111B to the ground line, one of the power source lines can be omitted, and designing of the substrate can be simplified.

Further, the common line 110A and the common line 111A may be connected to the ground line, and, when the detecting circuit removes the charges that have respectively accumulated in the plural accumulating portions, voltages of predetermined negative potentials may be applied respectively to the common line 110B and the common line 111B such that the driving voltage of the diodes 32B, that is based on the voltage level of the common line 110B, is made to be lower than the driving voltage of the diodes 112B, that is based on the voltage level of the common line 111B.

Further, the above-described respective exemplary embodiments describe cases in which one of each of the common lines 110A, 110B and the common lines 111A, 111B is provided. However, the present invention is not limited to the same, and plural each of these lines may be provided.

Further, in the above-described respective exemplary embodiments, a case is described in which the present invention is applied to the radiation image detecting device 100 that detects an image by detecting X-rays as electromagnetic waves which are the object of detection. However, the present invention is not limited to the same, and the electromagnetic waves, which are the object of detection, may be any of, for example, visible light, ultraviolet radiation, infrared radiation, or the like.

In addition, the structure of the radiation image detecting device 100 (see FIG. 1) and the structure of the TFT active matrix substrate 10 (see FIG. 2 through FIG. 5) that are described in the above exemplary embodiments are examples, and it goes without saying that appropriate changes are possible within a scope that does not deviate from the gist of the present invention.

For example, the present exemplary embodiments may include a radiation detecting device that has an active matrix substrate which is formed by disposing, on a silicon substrate made to have a size of an image detecting surface, CCDs (Charge-Coupled Devices) or CMOSs (Complementary Metal-Oxide Semiconductors) as an active matrix, and that has a signal detecting circuit including an amplifying circuit which is adjacent to the active matrix substrate.

As discussed above, one of the aspect of the present invention provides the image detecting device further including a detecting circuit including: plural second protection lines for protecting a circuit by discharging, to an exterior, excess charges accumulated at the data lines, plural third diodes whose anodes are connected to a portion of the plural second protection lines respectively, and whose cathodes are connected to the plural data lines respectively, and plural fourth diodes whose cathodes are connected to another portion of the plural second protection lines respectively, and whose anodes are connected to the plural data lines respectively, the detecting circuit being connected to the plural data lines, and removing charges that comprise accumulated respectively in the plural accumulating portions, and detecting charge amounts as information of respective pixels structuring the image; and a voltage applying section that when the charges that have accumulated respectively at the plural accumulating portions are removed by the detecting circuit, applies respective predetermined voltages to the first protection lines to which the first diodes are connected and to the second protection lines to which the third diodes are connected, such that a driving voltage of the first diodes, that is based on a voltage level of the first protection lines, is made to be higher than a driving voltage of the third diodes, that is based on a voltage level of the second protection lines, and applies respective predetermined voltages to the first protection lines to which the second diodes are connected and to the second protection lines to which the fourth diodes are connected, such that a driving voltage of the second diodes, that is based on a voltage level of the first protection lines, is made to be lower than a driving voltage of the fourth diodes, that is based on a voltage level of the second protection lines.

Another aspect of the present invention provides the image detecting device further including a detecting circuit including: plural second protection lines for protecting a circuit by discharging, to an exterior, excess charges accumulated at the data lines, plural third diodes whose anodes are connected to a portion of the plural second protection lines respectively, and whose cathodes are connected to the plural data lines respectively, and plural fourth diodes whose cathodes are connected to another portion of the plural second protection lines respectively, and whose anodes are connected to the plural data lines respectively, the detecting circuit being connected to the plural data lines, and removing charges that have accumulated respectively at the plural accumulating portions, and detecting charge amounts as information of respective pixels structuring the image; and a voltage applying section that connects, to a ground line, the first protection lines to which the second diodes are connected and the second protection lines to which the fourth diodes are connected, and when the charges that have accumulated respectively at the plural accumulating portions are removed by the detecting circuit, applies respective predetermined voltages of positive potentials to the first protection lines to which the first diodes are connected and to the second protection lines to which the third diodes are connected, such that a driving voltage of the first diodes, that is based on a voltage level of the first protection lines, is made to be higher than a driving voltage of the third diodes, that is based on a voltage level of the second protection lines.

Another aspect of the present invention provides the image detecting device further including a detecting circuit including: plural second protection lines for protecting a circuit by discharging, to an exterior, excess charges accumulated at the data lines, plural third diodes whose anodes are connected to a portion of the plural second protection lines respectively, and whose cathodes are connected to the plural data lines respectively, and plural fourth diodes whose cathodes are connected to another portion of the plural second protection lines respectively, and whose anodes are connected to the plural data lines respectively, the detecting circuit being connected to the plural data lines, and removing charges that have accumulated respectively in the plural accumulating portions, and detecting charge amounts as information of respective pixels structuring the image; and a voltage applying section that connects, to a ground line, the first protection lines to which the first diodes are connected and the second protection lines to which the third diodes are connected, and when the charges that have accumulated respectively in the plural accumulating portions are removed by the detecting circuit, applies respective predetermined voltages of negative potentials to the first protection lines to which the second diodes are connected and to the second protection lines to which the fourth diodes are connected, such that a driving voltage of the second diodes, that is based on a voltage level of the first protection lines, is made to be lower than a driving voltage of the fourth diodes, that is based on a voltage level of the second protection lines.

In the above-described aspects, the voltage applying section is a power source that supplies voltage to the detecting circuit.

In the above-described aspects, the substrate further includes high resistance members that connect the first protection lines, to which the first diodes are connected, and the first protection lines, to which the second diodes are connected.

Note that a bidirectional diode such as 30C; or the like may be used as the high resistance member.

In the above-described aspects, respective resistance values of the plural first protection lines are smaller than a resistance value of the high resistance members.

In the above-described aspects, given that the respective resistance values of the plural first protection lines are Ro and the resistance value of the high resistance members is Rd, a value of Rd/Ro is greater than or equal to 1000.

In the above-described aspects, the substrate further includes a semiconductor layer at which charges are generated due to the irradiation of incident electromagnetic waves, the high resistance members are bidirectional diodes that are structured by anodes and cathodes of two diodes respectively being connected to one another in parallel, and the image detecting device further comprises, between the semiconductor layer and any of the first diodes, the second diodes and the bidirectional diodes, blocking films that block the electromagnetic waves.

In the above-described aspects, the substrate further includes a wavelength converting layer that generates light due to the irradiation of incident electromagnetic waves, the high resistance members are bidirectional diodes that are structured by anodes and cathodes of two diodes respectively being connected to one another in parallel, and the image detecting device further comprises, between the wavelength converting layer and any of the first diodes, the second diodes and the bidirectional diodes, blocking films that block the light.

In the above-described aspects, the blocking films are connected to any of the plural first protection lines.

In the above-described aspects, at the substrate, the plural data lines are provided in parallel, and plural scan lines are further provided in parallel so as to intersect the plural data lines, and the blocking films do not intersect the data lines and the scan lines.

In this way, in accordance with the present invention, electrostatic defects at the time of manufacturing the substrate can be prevented, and further, fluctuations in signal values due to leak current at the time of driving can be suppressed.

What is claimed is:

1. An image detecting device comprising a substrate, the substrate comprising:
   a plurality of accumulating portions in which, due to the irradiation of incident electromagnetic waves expressing an image which is an object of detection, charges expressing the image are accumulated;
   a plurality of data lines to which the plurality of accumulating portions are respectively connected individually via switching elements;
   a plurality of first protection lines for protecting a circuit from excess voltage;
   a plurality of first diodes whose anodes are connected to a portion of the plurality of first protection lines respectively, and whose cathodes are connected to the plurality of data lines respectively;
   a plurality of second diodes whose anodes are connected to another portion of the plurality of first protection lines respectively, and whose cathodes are connected to the plurality of data lines respectively; and
   a detecting circuit connected to the plurality of data lines, the detecting circuit comprising:
      a plurality of second protection lines for protecting a circuit by discharging, to an exterior, excess charges accumulated at the data lines,
      a plurality of third diodes whose anodes are connected to a portion of the plurality of second protection lines respectively, and whose cathodes are connected to the plurality of data lines respectively, and
      a plurality of fourth diodes whose anodes are connected to another portion of the plurality of second protection lines respectively, and whose cathodes are connected to the plurality of data lines respectively,
      wherein the detecting circuit is adapted to remove charges accumulated respectively in the plurality of accumulating portions, and to detect charge amounts as information of respective pixels structuring the image.

2. The image detecting device according to claim 1, further comprising:
   a voltage applying section that
      when the charges that have accumulated respectively at the plurality of accumulating sections are removed by the detecting circuit, applies respective predetermined voltages to the first protection lines to which the first diodes are connected and to the second protection lines to which the third diodes are connected, such that a driving voltage of the first diodes, that is based on a voltage level of the first protection lines, is made to be higher than a driving voltage of the third diodes, that is based on a voltage of the second protection lines, and
      applies respective predetermined voltages to the first protection lines to which the second diodes are connected and to the second protection lines to which the fourth diodes are connected, such that a driving voltage of the second diodes, that is based on a voltage level of the first protection lines, is made to be higher than a driving voltage of the fourth diodes, that is based on a voltage of the second protection lines.

3. The image detecting device according to claim 1, further comprising:
   a voltage applying section that
      connects, to a ground line, the first protection lines to which the second diodes are connected and the second protection lines to which the fourth diodes are connected, and
      when the charges that have accumulated respectively at the plurality of accumulating portions are removed by the detecting circuit, applies respective predetermined voltages of positive potentials to the first protection lines to which the first diodes are connected and to the second protection lines to which the third diodes are connected, such that a driving voltage of the first diodes, that is based on a voltage level of the first protection lines, is made to be higher than a driving voltage of the third diodes, that is based on a voltage level of the second protection lines.

4. The image detecting device according to claim 1, further comprising:
   a voltage applying section that
      connects, to a ground line, the first protection lines to which the first diodes are connected and the second protection lines to which the third diodes are connected, and
      when the charges that have accumulated respectively in the plurality of accumulating portions are removed by the detecting circuit, applies respective predetermined voltages of negative potentials to the first protection lines to which the second diodes are connected and to the second protection lines to which the fourth diodes are connected, such that a driving voltage of the second diodes, that is based on a voltage level of the first protection lines, is made to be lower than a driving voltage of the fourth diodes, that is based on a voltage level of the second protection lines.

5. The image detecting device according to claim 2, wherein the voltage applying section is a power source that supplies voltage to the detecting circuit.

6. The image detecting device according to claim 3, wherein the voltage applying section is a power source that supplies voltage to the detecting circuit.

7. The image detecting device according to claim 4, wherein the voltage applying section is a power source that supplies voltage to the detecting circuit.

8. The image detecting device according to claim 1, wherein the substrate further comprises high resistance members that connect the portion of the first protection lines, to which the first diodes are connected, and the other portion of the first protection lines, to which the second diodes are connected.

9. The image detecting device according to claim 8, wherein respective resistance values of the plurality of first protection lines are smaller than a resistance value of the high resistance members.

10. The image detecting device according to claim 9, wherein, given that the respective resistance values of the plurality of first protection lines are Ro and the resistance value of the high resistance members is Rd, a value of Rd/Ro is greater than or equal to 1000.

11. The image detecting device according to claim 8, wherein
    the substrate further comprises a semiconductor layer at which charges are generated due to the irradiation of incident electromagnetic waves,
    the high resistance members are bidirectional diodes that are structured by anodes and cathodes of two diodes respectively being connected to one another in parallel, and
    the image detecting device further comprises, between the semiconductor layer and any of the first diodes, the second diodes and the bidirectional diodes, blocking films that block the electromagnetic waves.

12. The image detecting device according to claim 9, wherein
the substrate further comprises a semiconductor layer at which charges are generated due to the irradiation of incident electromagnetic waves,
the high resistance members are bidirectional diodes that are structured by anodes and cathodes of two diodes respectively being connected to one another in parallel, and
the image detecting device further comprises, between the semiconductor layer and any of the first diodes, the second diodes and the bidirectional diodes, blocking films that block the electromagnetic waves.

13. The image detecting device according to claim 10, wherein
the substrate further comprises a semiconductor layer at which charges are generated due to the irradiation of incident electromagnetic waves,
the high resistance members are bidirectional diodes that are structured by anodes and cathodes of two diodes respectively being connected to one another in parallel, and
the image detecting device further comprises, between the semiconductor layer and any of the first diodes, the second diodes and the bidirectional diodes, blocking films that block the electromagnetic waves.

14. The image detecting device according to claim 8, wherein
the substrate further comprises a wavelength converting layer that generates light due to the irradiation of incident electromagnetic waves,
the high resistance members are bidirectional diodes that are structured by anodes and cathodes of two diodes respectively being connected to one another in parallel, and
the image detecting device further comprises, between the wavelength converting layer and any of the first diodes, the second diodes and the bidirectional diodes, blocking films that block the light 15. The image detecting device according to claim 9, wherein
the substrate further comprises a wavelength converting layer that generates light due to the irradiation of incident electromagnetic waves,
the high resistance members are bidirectional diodes that comprise anodes and cathodes of two diodes respectively being connected to one another in parallel, and
the image detecting device further comprises, between the wavelength converting layer and any of the first diodes, the second diodes and the bidirectional diodes, blocking films that block the light 16. The image detecting device according to claim 10, wherein
the substrate further comprises a wavelength converting layer that generates light due to the irradiation of incident electromagnetic waves,
the high resistance members are bidirectional diodes that comprise anodes and cathodes of two diodes respectively being connected to one another in parallel, and
the image detecting device further comprises, between the wavelength converting layer and any of the first diodes, the second diodes and the bidirectional diodes, blocking films that block the light.

17. The image detecting device according to claim 11, wherein the blocking films are connected to any of the plurality of first protection lines.

18. The image detecting device according to claim 14, wherein the blocking films are connected to any of the plurality of first protection lines.

19. The image detecting device according to claim 14, wherein
at the substrate, the plurality of data lines are provided in parallel, and a plurality of scan lines are further provided in parallel so as to intersect the plurality of data lines, and
the blocking films do not intersect the data lines and the scan lines.

20. The image detecting device according to claim 14, wherein
at the substrate, the plurality of data lines are provided in parallel, and a plurality of scan lines are further provided in parallel so as to intersect the plurality of data lines, and
the blocking films do not intersect the data lines and the scan lines.

* * * * *